US012790208B2

(12) United States Patent
Weber et al.

(10) Patent No.: US 12,790,208 B2
(45) Date of Patent: Nov. 10, 2026

(54) METHOD FOR PRODUCING A PARTICLE PROTECTION ELEMENT, IN PARTICULAR A PARTICLE FILTER, FOR A MEMBRANE OF A PRESSURE SENSOR, PARTICLE PROTECTION ELEMENT, METHOD FOR PRODUCING A PRESSURE SENSOR, AND PRESSURE SENSOR

(71) Applicant: Robert Bosch GmbH, Stuttgart (DE)

(72) Inventors: Heribert Weber, Nuertingen (DE); Franziska Rohlfing, Leonberg (DE); Peter Schmollngruber, Aidlingen (DE); Sophielouise Mach, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 372 days.

(21) Appl. No.: 18/635,111

(22) Filed: Apr. 15, 2024

(65) Prior Publication Data

US 2024/0359975 A1 Oct. 31, 2024

(30) Foreign Application Priority Data

Apr. 26, 2023 (DE) ..................... 10 2023 203 847.1

(51) Int. Cl.
*G01L 19/06* (2006.01)
*B81C 1/00* (2006.01)

(52) U.S. Cl.
CPC ................................ *B81C 1/00793* (2013.01)

(58) Field of Classification Search
CPC ..... B81C 1/00793; B81C 1/0015; B81C 1/08; B81C 1/00214; B81C 1/00349–0038;
(Continued)

(56) References Cited

U.S. PATENT DOCUMENTS 10,640,367 B2 5/2020 Vummidi Murali et al.
2002/0168671 A1 11/2002 Burns et al.
(Continued)

FOREIGN PATENT DOCUMENTS

DE 102014214532 B3 10/2015
DE 102017115405 B3 12/2018
(Continued)

*Primary Examiner* — Robert R Raevis
(74) *Attorney, Agent, or Firm* — NORTON ROSE FULBRIGHT US LLP

(57) ABSTRACT

A method for producing a particle protection element. The method include: providing a substrate; applying a first silicon dioxide layer to a surface of the substrate and structuring the first SiO2 layer, a height of a later plurality of media passage structures of the particle protection element, which form a filter function with respect to penetrating particles, can be set based on a thickness of the first SiO2 layer; depositing a first polysilicon layer onto a surface of the first silicon dioxide layer and/or of the substrate, and structuring the first poly-Si layer for forming a later at least one first channel structure; and forming a later at least one second channel structure on the rear side of the substrate, wherein the later first channel structure and/or the later media passage structures and/or the later second channel structure are connectable with regard to a media flow.

15 Claims, 24 Drawing Sheets

(58) Field of Classification Search

CPC ........ B81C 1/00476; B81C 2201/0105; B81C 2201/013–0133; B81C 2201/0174; G01L 19/0636; B81B 2203/0127; B81B 7/0029; B81B 2201/0264

USPC ...... 73/706, 715–731; 438/48, 53, 381, 478, 438/689, 694, 700, 703, 761, 763, 778, 438/779, 787; 29/25.01, 25.02, 593, 902, 29/DIG. 77

See application file for complete search history.

(56) References Cited

U.S. PATENT DOCUMENTS

2016/0023890 A1* 1/2016 Reinmuth ............. B81B 7/0038 257/419
2025/0276893 A1* 9/2025 Tentori .................. B81B 7/0061

FOREIGN PATENT DOCUMENTS

EP 2599333 B1 1/2019
EP 4005972 A1 * 6/2022 ............. B81B 7/007

* cited by examiner 100
5
105
110
115
120,125
130
133
135
137
140
143
145
147
153
155
156
157,160
160
167
170
173
175
200
205
210
215
220,225
15,126
10
20

METHOD FOR PRODUCING A PARTICLE PROTECTION ELEMENT, IN PARTICULAR A PARTICLE FILTER, FOR A MEMBRANE OF A PRESSURE SENSOR, PARTICLE PROTECTION ELEMENT, METHOD FOR PRODUCING A PRESSURE SENSOR, AND PRESSURE SENSOR

CROSS REFERENCE

The present application claims the benefit under 35 U.S.C. § 119 of German Patent Application No. DE 10 2023 203 847.1 filed on Apr. 26, 2023, which is expressly incorporated herein by reference in its entirety.

FIELD

The present invention relates to a method for producing a particle protection element, in particular a particle filter, for a membrane of a pressure sensor and to a corresponding particle protection element. The present invention also relates to a method for producing a pressure sensor and to a corresponding pressure sensor.

BACKGROUND INFORMATION

A pressure sensor and a particle protection element, in particular a particle filter, are described in U.S. Pat. No. 10,640,367 B2. However, details regarding the production of the particle protection element are not specified in this patent.

It is an object of the present invention to specify both an improved production method for a particle protection element, in particular a particle filter, and also a pressure sensor. In addition, it is an object of the present invention to specify both an improved particle protection element, in particular a particle filter, and also an improved pressure sensor.

This object may be achieved by features of the present invention. Advantageous example embodiments of the present invention are disclosed herein.

SUMMARY

Provided according to the present invention is a method for producing a particle protection element, in particular a particle filter, for a membrane of a pressure sensor. According to an example embodiment of the present invention, the method comprises the following steps:

providing a substrate in a first step;

applying a first silicon dioxide layer to a surface of the substrate and structuring the first silicon dioxide layer and/or applying a second silicon dioxide layer to the structured first silicon dioxide layer and/or structuring the second silicon dioxide layer in a second step;

depositing a first polysilicon layer onto a surface of the first silicon dioxide layer and/or onto a surface of the second silicon dioxide layer and/or of the substrate and structuring the first polysilicon layer to form a later at least one first channel structure in a third step, and/or depositing a first polysilicon layer onto a surface of the first silicon dioxide layer and applying a second silicon dioxide layer to a surface of the first polysilicon layer and a second polysilicon layer to a surface of the second silicon dioxide layer and/or to a surface of the first polysilicon layer and structuring the first polysilicon layer and/or the second polysilicon layer and/or the second silicon dioxide layer to form a later at least one first channel structure in a third step, wherein a height of a later plurality of media passage structures, in particular gas passage structures, of the particle protection element, which form a filter function with respect to penetrating particles, and/or a height of the later at least one first channel structure is adjustable on the basis of a thickness of the first silicon dioxide layer and/or a thickness of the second silicon dioxide layer; and forming a later at least one second channel structure through the substrate starting from the rear side of the substrate in a fourth step, wherein the later at least one first channel structure and/or the later plurality of media passage structures and/or the later at least one second channel structure are designed to be connectable with regard to a media flow. With regard to a media flow can also be understood as a media stream.

Further provided according to the present invention is a particle protection element, in particular a particle filter, which has been produced according to the aforementioned method of the present invention.

Structuring the individual aforementioned layers can in this case mean the purposeful local or regional removal of material by means of an etching process, wherein the etching process can be designed as a wet-chemical, plasma-based and/or gaseous etching process or gas-phase etching process. Conventional etching media and etching methods from semiconductor technology can be used as etching media and etching methods, wherein, for removing silicon dioxide, for example from sacrificial layer regions, wet-chemical and/or gaseous etching media containing hydrofluoric acid can preferably be used in corresponding etching processes.

According to an example embodiment of the present invention, applying the second silicon dioxide layer to the structured first silicon dioxide layer in the second step may include the second silicon dioxide layer also being applied to the surface of the substrate that has been exposed during the structuring of the first silicon dioxide layer.

According to an example embodiment of the present invention, the connectable design of the at least one first channel structure and/or of the later plurality of media passage structures and/or of the later at least one second channel structure with regard to a media flow comprises the at least one first channel structure and the later plurality of media passage structures forming a contiguous structure, i.e., a contiguous zone of material of the first silicon dioxide layer and/or of the second silicon dioxide layer, and the at least one second channel structure stops/ends directly at the first silicon dioxide layer in the region of the at least one first channel structure.

The later at least one first channel structure and/or the later plurality of media passage structures can each be arranged on the front side of the substrate, i.e., on the surface thereof or on the layers applied to or deposited onto the surface of the substrate. This can correspond to the front side of the particle protection element, while the at least one second channel structure can be arranged on the rear side of the particle protection element, i.e., on the side of the substrate that is opposite the front side. If the substrate or the particle protection element is rotated, it is understood that the mentioned front side of the substrate or the surface of the substrate or the front side of the particle protection element together with the first channel structure and/or with the plurality of media passage structures as well as the rear side of the substrate or of the particle protection element together with the second channel structure are then likewise rotated.

The first channel structure and/or the second channel structure as well as the plurality of media passage structures can each be regarded as channels or openings or structures.

According to an example embodiment of the present invention, during the production of the later plurality of media passage structures (preferably gas passage structures) of the particle protection element or of the cap, the use of a first silicon dioxide layer (SiO2), for example of a defined thickness, and/or of a second silicon dioxide layer of a defined thickness, in each case as a sacrificial layer, can advantageously be used to define the height, i.e., the cross section, of the plurality of media passage structures/media passage channels. The plurality of media passage structures thus act as filter structures. The media passage structures can be used not only when using gaseous media, but also when using liquid media. Via the choice of the number of the respective channel structures and the channel cross sections thereof, it is possible to exert almost any influence on a filter effect with respect to particles and influence on the flow resistance of a medium through the particle protection element.

In contrast to the production of media passage structures/channel structures by means of conventional photolithographic exposure methods, significantly smaller cross sections of media passage structures can thereby be achieved. By purposefully arranging a plurality of media passage structures in the walls of at least one first channel structure, it is furthermore possible to influence the damping-dependent behavior of a pressure signal. This approach also offers the possibility of being able to use standard packaging methods and thus to achieve a cost advantage over packaging-based particle protection, for example integrated in a housing.

However, a plurality of second channel structures, starting from the rear side of the substrate, does not necessarily have to be provided. Via the number and the geometric properties of the first channel structures and of the second channel structures through the substrate, it is also possible to influence the speed of a gas exchange between the front side and rear side as well as the mechanical stability of the gas-permeable region of a particle protection element.

By means of the connectable design of the later at least one first channel structure and/or of the later plurality of media passage structures and/or of the later at least one second channel structure with regard to a media flow, a bilateral media exchange (e.g., gas exchange) between the front side (top side) and the rear side (bottom side) of the particle protection element can advantageously be made possible, and a membrane of a pressure sensor element can be protected from penetrating particles (e.g., dust, dirt, etc.).

According to an example embodiment of the present invention, the particle protection element or the media-permeable, in particular gas-permeable, cap is preferably produced in a separate production process. The particle protection element on the basis of a substrate which is in particular designed as a silicon wafer offers the advantage that particle protection of a membrane of the pressure sensor can already take place during the production of a pressure sensor or pressure sensor element.

The particle protection element is subsequently connected to a further substrate, which is designed as a pressure sensor element or forms a pressure sensor wafer, by means of conventional connection techniques/bonding methods, such as eutectic bonding, e.g., Al/Ge bonding, thermocompression bonding, e.g., Au/Au bonding, seal glass bonding, adhesive methods, etc.

In a further example embodiment of the present invention, depositing and structuring the first polysilicon layer (poly-Si) and/or the second polysilicon layer in the third step comprises forming silicon dioxide regions covered with the first polysilicon layer, and/or silicon-dioxide-free regions.

The silicon dioxide regions covered with the first polysilicon layer and/or the second polysilicon layer can later be used to form the at least one first channel structure and the plurality of media passage structures. In the silicon-dioxide-free regions, material of the first polysilicon layer and/or of the second polysilicon layer is deposited, for forming a later plurality of structure-fastening anchoring structures, which serve to anchor a later cover spanning the at least one first channel structure and to form the plurality of media passage structures. A width of the later at least one first channel structure and/or a width of the later plurality of media passage structures can be set on the basis of a distance of adjacent anchoring structures of the later plurality of anchoring structures.

The lateral dimensions and the shape of the plurality of anchoring structures can in this case advantageously be selected as desired. The height of the anchoring structures results from the thickness of the first and/or of the second silicon dioxide layer. The shape of a cover (of the front side of the particle protection element) which is fastened to the front side of the substrate by means of anchoring structures can be selected as desired. Alternatively, the cover can also be understood to mean a covering region or a silicon cover or a polysilicon cover or a channel cover of the at least one first channel structure. The anchoring structures can be formed at least in regions circumferentially around the contour of the at least one first channel structure and can respectively be mechanically and optionally also electrically connected on one side to the cover of the at least one first channel structure and on one side to the substrate.

Long etching times and different etching rates over the substrate or Si substrate in combination with a thin first silicon dioxide layer can lead to the first silicon dioxide layer being through-etched locally, i.e., in regions, on the substrate during the production of the at least one second channel structure. In this case, through-etching of the first polysilicon layer on the front side of the substrate can furthermore also occur, which would result in a filter function with respect to particles of a certain size in consequence of the plurality of media passage structures or media passage channels no longer being present. In order to avoid this, a first silicon dioxide layer of any thickness can be provided on the front side of the substrate or top side, said silicon dioxide layer being structured in such a way that the oxide of the first silicon dioxide layer is removed only in a region of the later media passage structures. Following this, a second silicon dioxide layer produced by means of conventional methods, such as by thermal oxidation or by CVD deposition, is provided at least in this region. The thickness of the second silicon dioxide layer later defines the height of a media passage structure.

Following this, silicon dioxide is removed in the regions in which anchoring structures are to be produced later. The further procedure can here take place analogously to what has already been described above. By providing a thicker first silicon dioxide layer, it is advantageously possible to purposefully provide a thicker silicon dioxide layer in the regions in which an etching process is to stop safely on the silicon dioxide layer. A further advantage when using a thicker first silicon dioxide layer is that due to the thicker first silicon dioxide layer the first channel structures on the front side of the substrate receive a larger channel cross section at least in regions and the flow resistance of a medium, e.g., a gas, through the filter system can thus be further reduced.

In a further example embodiment of the present invention, for forming the later at least one second channel structure through the substrate, a mask for structuring, in particular a photoresist mask and/or a silicon dioxide hard mask, is applied to the rear side of the substrate in the fourth step, and the structuring of the substrate is carried out. The at least one second channel structure is advantageously formed such that the structuring, i.e., the etching process, stops at the first silicon dioxide layer within a first channel structure provided with gas-permeable boundaries/walls.

In a further example embodiment of the present invention, the first silicon dioxide layer and/or the second silicon dioxide layer can be used as a silicon dioxide hard mask. Advantageously, the first silicon dioxide layer and/or the second silicon dioxide layer can serve as buried etching masks. In an exemplary embodiment in which the second silicon dioxide layer and the second polysilicon layer are applied to the first polysilicon layer and in each case structured, the second silicon dioxide layer can be used as a silicon dioxide hard mask/etching mask. During the structuring of the second polysilicon layer, this etching mask can also be used to etch the first polysilicon layer in such a way that, in regions outside of first channel structures, the first silicon dioxide layer is exposed between media-permeable, i.e., gas-permeable, boundaries/walls. Here, too, the etching process after the etching of the first polysilicon layer stops at the first silicon dioxide layer. By means of the procedure described here, the particle protection element or the Si covers over first channel structures can be designed to be spaced apart from the surface of the substrate delimiting the first channel structures. During the production of further, e.g., second channel structures through the substrate, a mechanical contact between channel covers and chucks or trays in processing systems and/or handling systems in the production process can thus be prevented. Here, too, all silicon dioxide layers in the region of the media passage structures or filter structures and of first channel structures on the front side of the substrate can be removed by means of BOE or by an HF gas-phase etching step.

In a further example embodiment of the present invention, substrate material on the rear side of the substrate can be removed or the substrate on the rear side can be thinned before the formation of the later at least one second channel structure, starting from the rear side of the substrate. The removal or purposeful thinning of the substrate to a target thickness can advantageously take place by means of a grinding process and/or polishing process. Advantageously, the overall height of the particle protection element can thereby be reduced so that the particle protection element can be produced to be very compact, i.e., very thin.

In a further example embodiment of the present invention, regions of silicon dioxide can be embedded in the first polysilicon layer and/or in the second polysilicon layer, which regions serve as etch stop structures when forming the later at least one first channel structure in the third step and/or when forming the later at least one second channel structure from the rear side of the substrate through the substrate in the fourth step. Advantageously, slight etching of the first polysilicon layer and/or of the second polysilicon layer can thus be avoided, and the etch stop structures can optionally be removed again, for example after the production of the at least one second channel structure. Alternatively, through-etching of the first polysilicon layer and/or of the second polysilicon layer can be avoided by providing the mentioned layers of a sufficient thickness, which does, however, increase the overall height of the particle protection element. In the alternative described, it must however be ensured that providing the sufficiently thick first polysilicon layer and/or the sufficiently thick second polysilicon layer does not result in a pressure access to the membrane of the pressure sensor that has an undesirably large cross-sectional area.

In a further example embodiment of the present invention, the method furthermore comprises the step of removing the first silicon dioxide layer and/or the second silicon dioxide layer in a fifth step by means of an etching process via an access through the first and/or second polysilicon layer to the later at least one first channel structure and/or to the later plurality of media passage structures and/or of removing the first silicon dioxide layer and/or the second silicon dioxide layer in a fifth step by means of an etching process via the formed at least one second channel structure through the substrate.

Advantageously, after removing the first silicon dioxide layer and/or the second silicon dioxide layer by means of an etching process, which can preferably take the form of a BOE or HF gas-phase etching process, the plurality of media passage structures, which extend through boundaries/walls of first channel structures and whose height is defined by the thickness of the first and/or the second silicon dioxide layer and whose width is defined by the distance from adjacent anchoring structures, is produced at/on the front side of the substrate.

In a further example embodiment of the present invention, the at least one first channel structure, which has been exposed in the fifth step, and/or the exposed plurality of media passage structures essentially has a meandering course. Advantageously, the number, the shape and the geometric dimensions of the at least one second channel structure can vary as desired, starting from the rear side of the substrate. This flexibility (number, shape, geometry) advantageously also applies to the at least one first channel structure and/or the plurality of media passage structures. It is advantageously possible in this way to produce structures/first channel structures with long gas-permeable boundaries/walls which make possible a rapid, bilateral, media exchange (preferably gas exchange) between a front side and a rear side of the particle protection element. Via the length of the gas-permeable boundaries/walls of structures/first channel structures, it can furthermore be ensured that even a greater number of media passage structures blocked/closed off with particles will not have any influence on a gas exchange through boundaries/walls of first channel structures.

Via the shape and the geometric dimensions of the at least one media passage channel structure of the plurality of media passage channel structures and/or of the at least one first channel structure and/or of the at least one segment and/or of the at least one connection channel structure, a large-area filter structure can advantageously be generated/produced on a relatively small area.

In a further example embodiment of the present invention, the at least one first channel structure, which has been exposed in the fifth step, and/or the exposed plurality of media passage structures can be arranged essentially in the form of a plurality of segments which can be connected by means of connection channels and/or comprise an access to the at least one second channel structure. Advantageously, segments or regions of the particle protection element can be connected to one another as desired via the aforementioned connection channels so that the particle protection element can be produced very flexibly. Advantageously, at least one segment or at least one region of the particle protection element can be connected to the at least one second channel structure via a separate access, wherein the at least one second channel structure can be arranged, for example, outside of the at least one segment and/or outside of the region of the particle protection element designed as a media passage structure. In this way, the second channel structure can, for example, end in a later cavity region of a pressure sensor and at least one portion/region of the plurality of media passage structures can be arranged outside of the cavity region.

In addition, according to an example embodiment of the present invention, the segments can comprise a cover comprising, for example, the material of the first polysilicon layer, wherein the cover is connected to the surface of the substrate via the plurality of anchoring structures. The plurality of anchoring structures can be provided at least in regions circumferentially around the contour of a segment between the cover associated with the segment and the surface of the substrate.

Via the shape and the geometric dimensions of the at least one media passage channel structure of the plurality of media passage channel structures and/or of the at least one first channel structure and/or of the at least one segment and/or of the at least one connection channel structure, a large-area filter structure can advantageously be generated/produced on a relatively small area.

In a further example embodiment of the present invention, when structuring the substrate, i.e., when forming the later at least one second channel structure and/or when forming the at least one first channel structure and/or the plurality of media passage structures when structuring the first polysilicon layer and/or the second polysilicon layer, stiffening structures contiguous at least in portions can in each case be formed. This can advantageously improve the mechanical stability or the robustness of the particle protection element. The stiffening structures can be designed to be contiguous at least in portions and optionally separated from the surrounding substrate and/or optionally separated from the surrounding polysilicon layer. Contiguous at least in portions can in this case be understood as being connected to one another via certain regions. In this case, the stiffening structures can also be connected to the surrounding substrate and/or to the surrounding polysilicon layer In a further example embodiment of the present invention, the later plurality of media passage structures and/or the later at least one first channel structure and/or the later at least one second channel structure are designed to be coatable, in particular coatable hydrophobically or hydrophilically. The hydrophobic or hydrophilic coating provided can, for example, be a non-stick layer (AHS), which prevents a liquid medium from passing through the plurality of media passage structures, i.e., the filter structures, due to the edge angle forming on the non-stick layer, or a coating which makes possible better wetting of at least one of the surfaces of the plurality of media passage structures, i.e., of the filter structures, in order to achieve a better flow of a liquid medium. Through the height, width and length of the at least one first channel structure, of the plurality of media passage structures and of the at least one second channel structure and through the edge angle of the medium on the surface of the at least one first channel structure, of the plurality of media passage structures and of the at least one second channel structure, it is thus possible, for example in the case of a hydrophobic layer to set a watertightness down to a particular water depth.

Furthermore, according to an example embodiment of the present invention, a method for producing a pressure sensor is proposed, comprising the following steps:

- in a first step providing a further substrate, which is designed as a pressure sensor element and has a membrane;
- in a second step providing a particle protection element for the membrane of the further substrate, which is designed as a pressure sensor element, wherein the particle protection element is produced according to the aforementioned production method; and
- in a third step connecting the further substrate and the particle protection element by means of a bonding method, in particular a wafer bonding method, and/or by means of an adhesive method.

Also proposed is a pressure sensor which has been produced according to the aforementioned method.

According to an example embodiment of the present invention, after the removal of the first and second silicon dioxide layers or further silicon dioxide layers in the production method of the particle protection element, the substrate forming/constituting the particle protection element is connected as a cap wafer to a further substrate (likewise a Si substrate), which is designed as a pressure sensor element, in such a way that, after the processing has been fully completed, a gaseous medium can be conducted to the membrane of the pressure sensor via the first channel structures and the trench structures produced in the first and/or second polysilicon layer and the second channel structures, and a pressure of the gaseous medium can be measured. In this way, a pressure sensor having the aforementioned features, whose membrane can already be protected during the production process by using the particle protection element, can advantageously and simply be provided.

In a further example embodiment of the present invention, the further substrate and the particle protection element are connected by means of the bonding method, in particular the wafer bonding method, and/or by means of the adhesive method in the third step in such a way that bond structures and/or adhesive joints are arranged on the rear side of the substrate of the particle protection element and/or bond structures and/or adhesive joints are arranged on a front side of the particle protection element.

If corresponding bond areas or bond structures and/or adhesive areas or adhesive structures are provided on the layer system on the front side of the substrate or on the rear side of the substrate, a previously described substrate (Si wafer), which forms/constitutes a particle protection element, or the gas-permeable cap wafer can be connected in a simple manner to a further substrate, for example designed as a pressure sensor element (or pressure sensor wafer). A possible bond connection, in particular a wafer bond connection, can, for example, be a eutectic Al/Ge bond connection, a seal-glass bond connection, an Au/Au thermocompression bond connection, a solder connection or an at least punctiform laser-assisted bond connection. Alternatively, a substrate (Si wafer) forming/constituting a particle protection element, or a gas-permeable cap wafer, can be connected by an adhesive connection to a further substrate designed, for example, as a pressure sensor element (or pressure sensor wafer). Advantageously, the substrate and/or the further substrate can also be brought to a desired target thickness by a grinding process and/or polishing process, as mentioned above.

In a further example embodiment of the present invention, the further substrate and the substrate forming/constituting the particle protection element are first connected in the third step, before forming the later at least one second channel structure through the substrate from the rear side of the substrate forming/constituting the particle protection element in the fourth step. Advantageously, in this way, the substrate forming/constituting the particle protection element and/or the further substrate can first be brought to a desired target thickness as mentioned above, and the at least one second channel structure can only be formed thereafter. This can advantageously prevent the at least one second channel structure from being blocked/closed by removed material during removal/thinning of the substrate, forming/constituting the particle protection element, or of the further substrate.

The above-described properties, features, and advantages of the present invention and the way in which they are achieved become clearer and more readily comprehensible in connection with the following description of exemplary embodiments, which are explained in more detail in connection with the schematic figures.

The figures are merely schematic and are not true to scale. In this sense, components and elements shown in the figures may be shown exaggeratedly large or reduced in size for better understanding. It is also pointed out that the reference signs in the figures have been selected to be unchanged or similar for elements and/or components that are designed identically or similarly.

DETAILED DESCRIPTION OF EXAMPLE EMBODIMENTS

Figure 1:
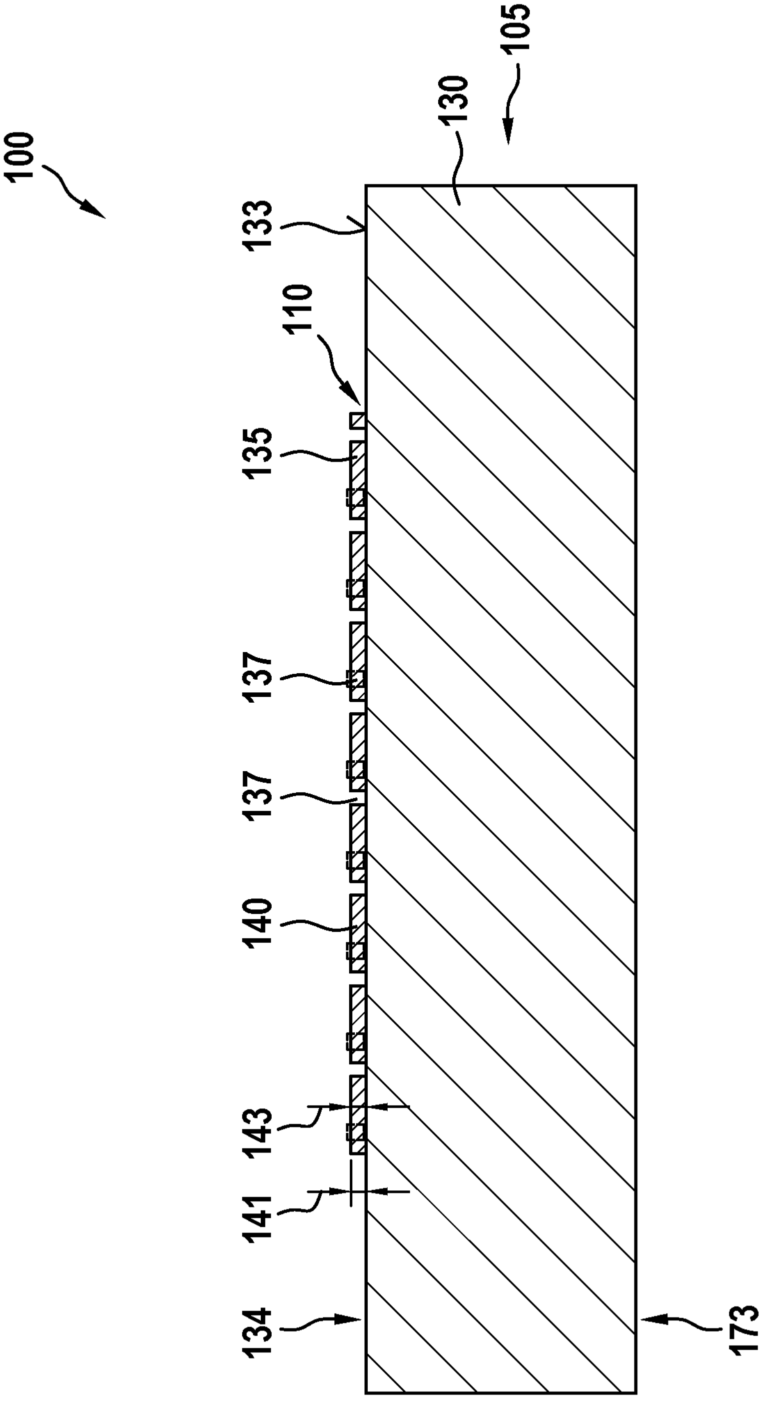
FIG. 1 shows a schematic representation of a first and a second step of a method for producing a particle protection element for a membrane of a pressure sensor according to a first embodiment of the present invention.

FIG. 1 by way of example shows a method 100 for producing a particle protection element for a membrane of a pressure sensor according to a first embodiment. The pressure sensor or the method for producing the pressure sensor is/are also shown in the following figures. In a first step 105, the proposed method 100 comprises providing a substrate 130 having a front side 134 and a rear side 173. The substrate 130 can in this case be designed as a silicon substrate. In a second step 110, a first silicon dioxide layer 135 is applied as a sacrificial layer to a surface 133 of the substrate 130 and is structured 137. A height 141 of a later plurality of media passage structures 140, in particular gas passage structures (alternatively, a liquid, for example water, to which the later plurality of media passage structures 140 is later permeable, is also conceivable as a medium) of the particle protection element 10, which form a filter function with respect to penetrating particles, can be set on the basis of a thickness 143 of the first silicon dioxide layer 135.

Structuring 137 the first silicon dioxide layer 135 in the second step 110 further comprises forming silicon dioxide-free regions for the production of a later plurality of structure-fastening anchoring structures 175. In other words, the plurality of anchoring structures can be formed where the first silicon dioxide layer 135 has been removed. The plurality of anchoring structures 175 are inter alia designed for structure-fastening purposes. A height 183 of the later plurality of anchoring structures 175 can be set on the basis of a thickness 143 of the first silicon dioxide layer 135 (comparably to the aforementioned adjustable height 141 of the later plurality of media passage structures 140, based on the thickness 143 of the first silicon dioxide layer 135). A width 185 of the later plurality of media passage structures 140 can be set on the basis of a distance 176 from adjacent anchoring structures 175 of the later plurality of anchoring structures 175 (cf., for example, FIG. 4).

Figure 2:
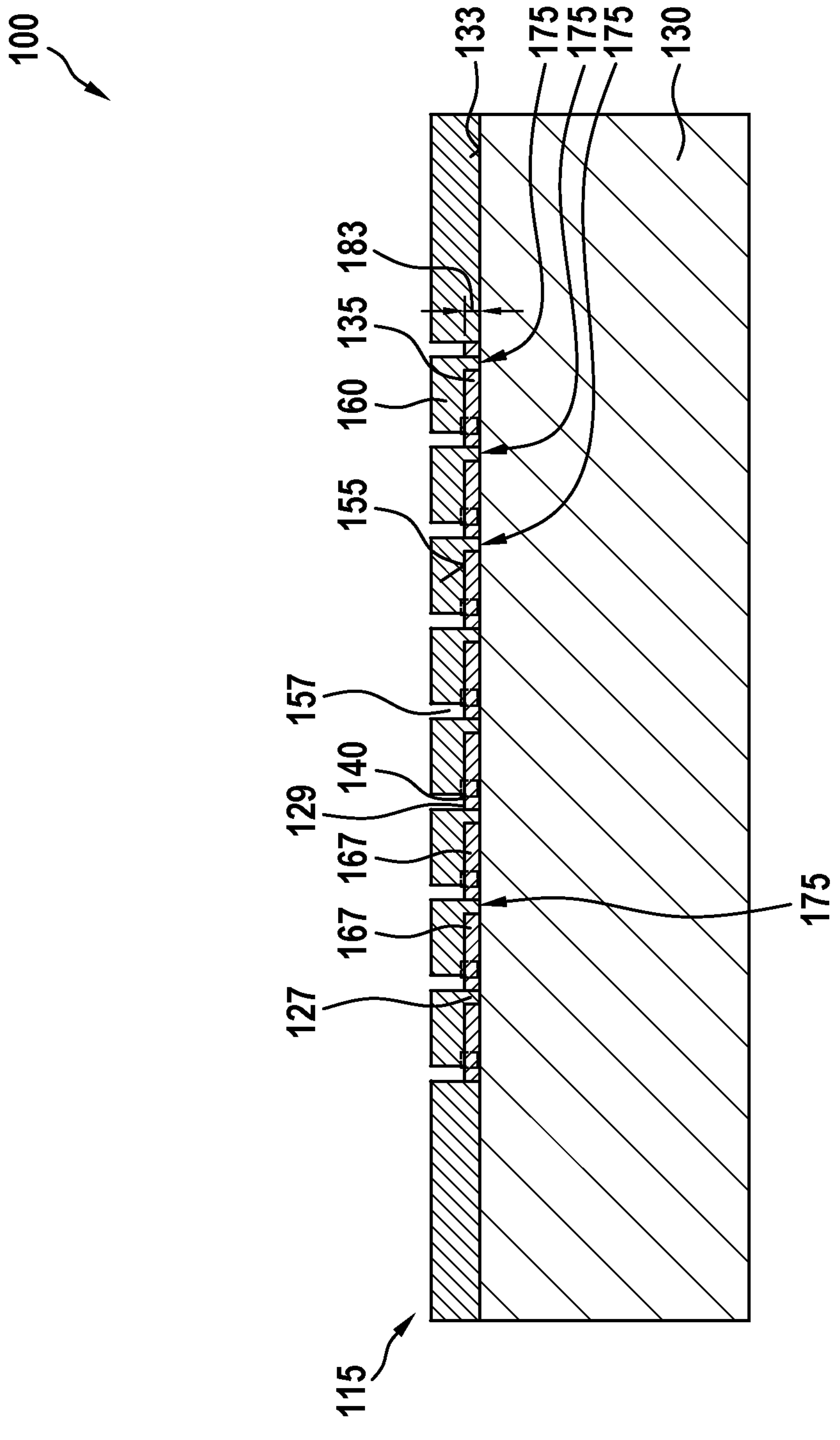
FIG. 2 shows a schematic representation of a third step of the method for producing a particle protection element according to the first embodiment of the present invention.

FIG. 2 shows a schematic representation of a third step 115 of the method 100 for producing the particle protection element 10 according to the first embodiment. The third step 115 of the method 100 comprises depositing a first polysilicon layer 160 onto a surface 155 of the first silicon dioxide layer 135 and onto a surface 133 of the substrate 130, and structuring 157 the first polysilicon layer 160 to form an etching access or media access 188 to a later at least one first channel structure 167. In this case, depositing and structuring 157 the first polysilicon layer 160 in the third step 115 (together with the above-explained structuring 137 of the first silicon dioxide layer 135 in the second step 110) can comprise forming the later plurality of structure-fastening anchoring structures 175 having the material of the first polysilicon layer 160, and the etching process for structuring 157 the first polysilicon layer 160 can stop/end at the first silicon dioxide layer 130. At the locations at which the first silicon dioxide layer 135 has been removed and which are to serve for producing the later plurality of anchoring structures 175, and the first polysilicon layer 160 is deposited onto the surface of structures having the material of the first silicon dioxide layer 135 in such a way that the deposited first polysilicon layer 160 completely covers the structures having the material of the first silicon dioxide layer 135 and the plurality of anchoring structures 175 having the material of the first polysilicon layer 160 is formed, at which anchoring structures the silicon cover or polysilicon cover of the at least one first channel structure 167 is attached, i.e., fastened, to the substrate 130.

Furthermore, boundaries 127 of a later at least one first channel structure 167 and a region between the boundaries of the later at least one first channel structure 167 are shown in FIG. 2. The boundaries 127 constitute anchoring structures 175, which are provided at least in regions circumferentially around the contour of at least one first channel structure 167 and via which the silicon cover or polysilicon cover of the at least one first channel structure 167 are mechanically and optionally also electrically connected to the substrate 130.

Figure 3:
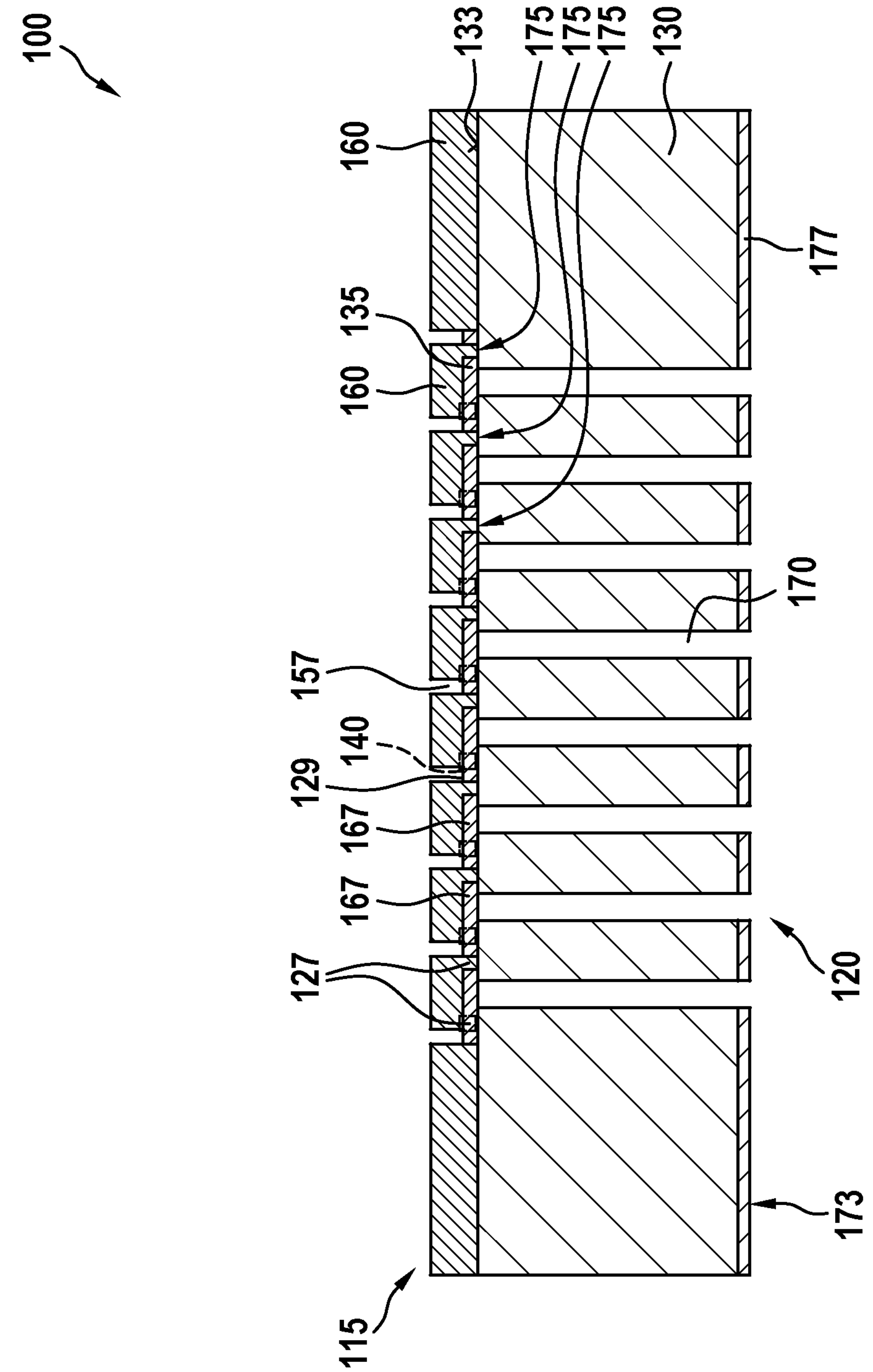
FIG. 3 shows a schematic representation of a fourth step of the method for producing a particle protection element according to the first embodiment of the present invention.

FIG. 3 shows a schematic representation of a fourth step 120 of the method 100 for producing the particle protection element 10 according to the first embodiment. The fourth step 120 of the method 100 comprises forming a later at least one second channel structure 170, which, starting from the rear side 173 of the substrate 130, extends completely through the substrate 130 to the top side 133 thereof.

For forming the later at least one second channel structure 170 starting from the rear side 173 of the substrate 130 in the fourth step 120, a mask, for example a photoresist mask 177 and/or a silicon dioxide hard mask, is applied to the rear side 173 of the substrate 130.

The later at least one first channel structure 167 and/or the later plurality of media passage structures 140 and/or the later at least one second channel structure 170 are designed to be connectable with regard to a media flow. This comprises the at least one first channel structure 167 and the later plurality of media passage structures 140 forming a contiguous structure, i.e., a contiguous zone made of material of the first silicon dioxide layer 135, and the at least one second channel structure 170 stopping/ending in the region of the at least one first channel structure 167, and at least one etching access or media access 188 through the first polysilicon layer 160 stopping/ending in the region outside of the at least one channel structure 167 directly on the first silicon dioxide layer 135.

In addition, a region 129 between the boundaries of adjacent channel structures is shown in FIG. 3.

Figure 4:
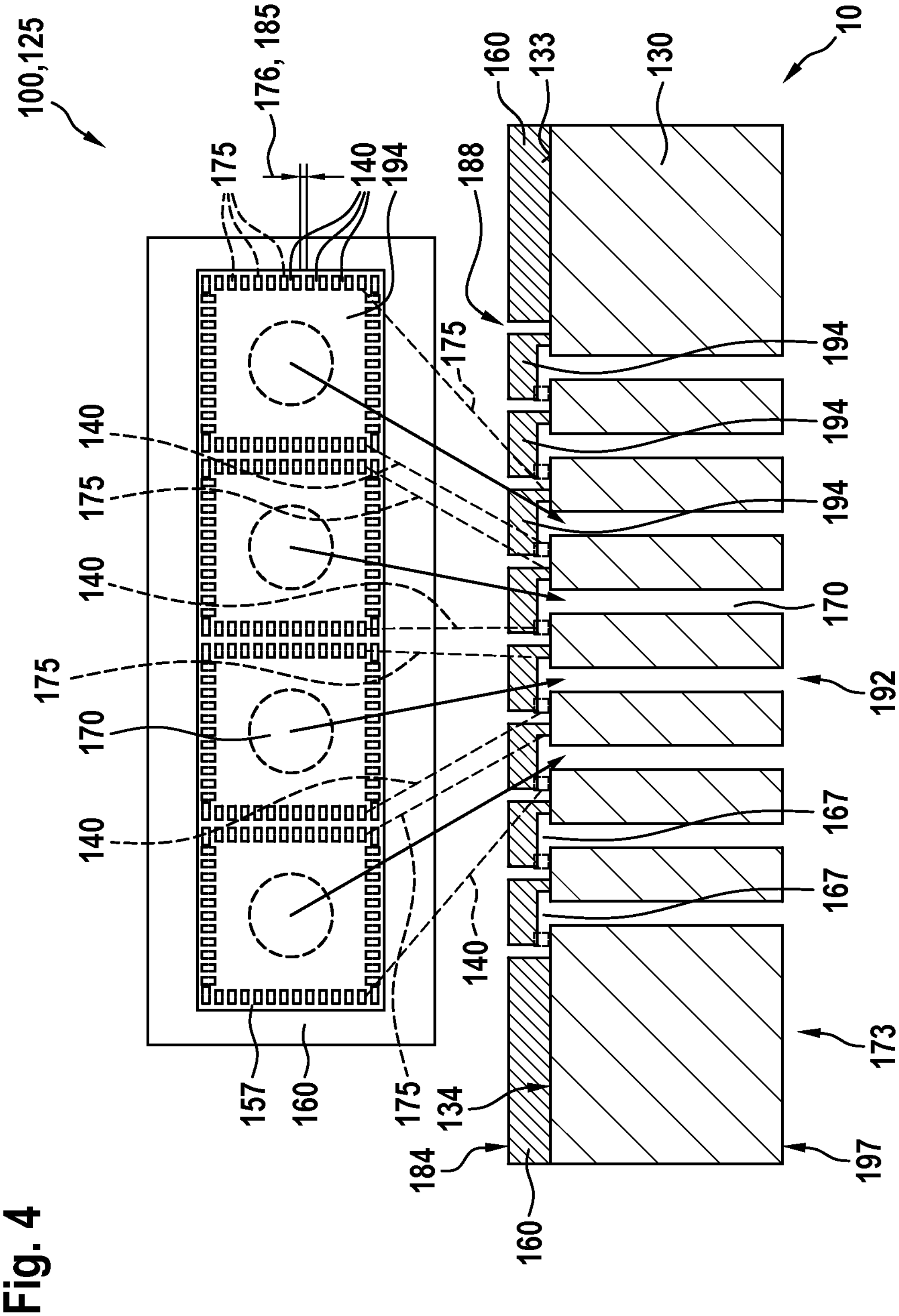
FIG. 4 shows a schematic representation of a fifth step of the method for producing a particle protection element according to the first embodiment and a particle protection element according to a first embodiment of the present invention.

FIG. 4 shows a schematic representation of a fifth step 125 of the method 100 for producing the particle protection element 10 according to the first embodiment and the particle protection element 10 according to the first embodiment. The fifth step 125 of the method 100 comprises removing the first silicon dioxide layer 135 by means of an etching process 192, which can preferably be designed in the form of a wet-chemical BOE etching process or in the form of a gaseous HF gas-phase etching process. Removing the first silicon dioxide layer 135 by means of an etching process 192 in the region of the later at least one first channel structure 167 and/or in the region of the later plurality of media passage structures 140 in this case takes place via an access 188 through the first polysilicon layer 160 and via the at least one second channel structure 170, which is formed, starting from the rear side of the substrate 130, through the substrate 130 and ends at the first silicon dioxide 135.

In FIG. 4, in the lower half of the figure, which shows a cross section of the particle protection element 10 having a front side 184 of the particle protection element 10 and a rear side 197 of the particle protection element 10, the finished plurality of anchoring structures 175 can be clearly seen, whose height 183 has been set on the basis of the thickness 143 of the first silicon dioxide layer 135, as explained above. In addition, the finished plurality of media passage structures 140 can be seen, whose height 141 has likewise been set on the basis of the thickness 143 of the first silicon dioxide layer 135 and whose width 185 has been set on the basis of the distance 176 of adjacent anchoring structures 175 of the plurality of anchoring structures 175, as explained above.

In the upper figure region of FIG. 4, a plan view of the particle protection element 10 is shown. The at least one first channel structure 167, which has been exposed in the fifth step 125, and the exposed plurality of media passage structures 140 are basically arranged in the form of a plurality of segments 194. A segment 194 can in each case comprise the at least one first channel structure 167, the plurality of media passage structures 140, and the plurality of anchoring structures 175. In addition, a segment 194 can in each case be connected to the at least one second channel structure 170. The segments 194 can comprise a cover having, for example, the material of the first polysilicon layer 160, wherein the cover is connected to the surface 133 of the substrate 130 via the plurality of anchoring structures 175. The plurality of anchoring structures 175 can be provided at least in regions circumferentially around the contour of a segment 194 between the cover associated with the segment 194 and the surface 133 of the substrate 130.

Figure 5:
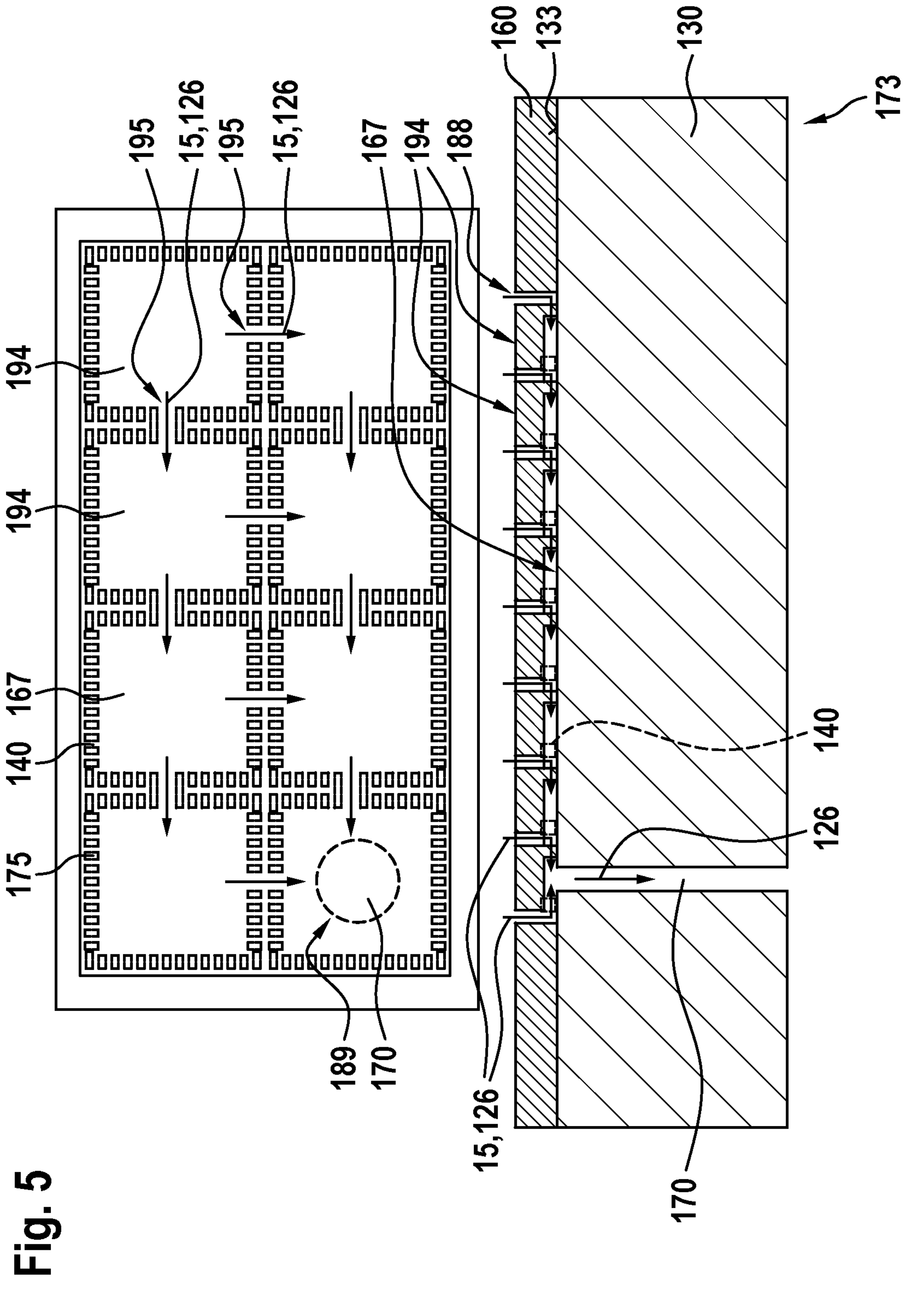
FIG. 5 shows a first further schematic representation of an exposed at least one first channel structure and/or of an exposed plurality of media passage structures, according to an example embodiment of the present invention.

FIG. 5 shows a first further schematic representation of at least one segment 194 consisting of at least one exposed first channel structure 167 covered with the first polysilicon layer 160, wherein the first polysilicon layer 160 covering the at least one first channel structure 167 is fastened, i.e., anchored, to the surface 133 of the substrate 130 by means of a plurality of anchoring structures 175, and a media passage structure 140 is provided between at least two anchoring structures 175.

In contrast to the previous FIG. 4, the plan view in the upper half of the figure shows that a plurality of arranged segments 194 can in each case be connected to one another by means of connection channels 195. In the representation, a segment of the plurality of segments 194 has an access 189 to the at least one second channel structure 170. Also shown are possible flow directions of the medium, e.g., gas, through the connection channels 195 in the direction of the access 189 of the at least one second channel structure 170. In this example, a segment has at least two connection channels 195 to adjacent segments of the plurality of segments 194.

Figure 6:
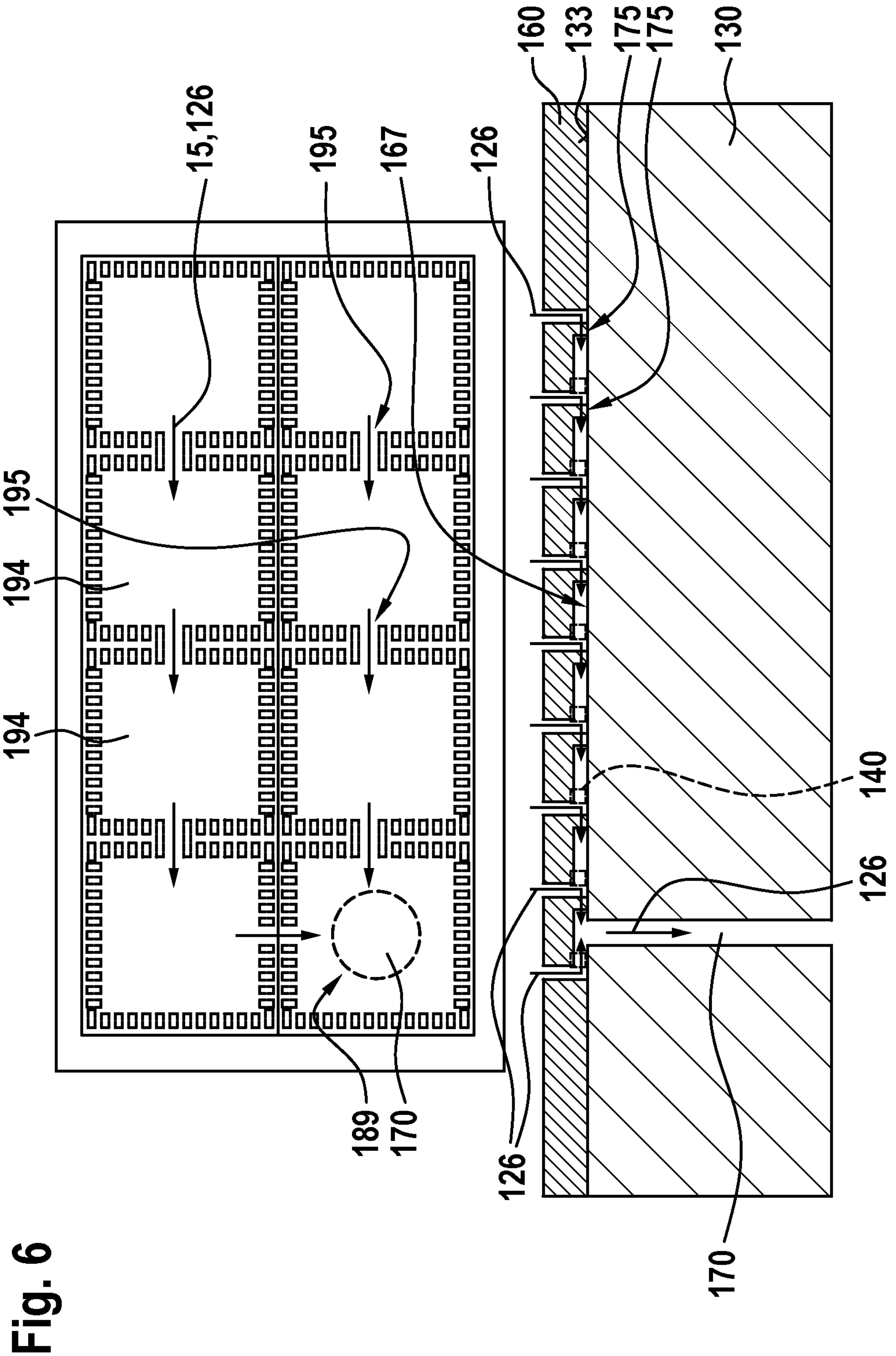
FIG. 6 shows a second further schematic representation of an exposed at least one first channel structure and/or of an exposed plurality of media passage structures, according to an example embodiment of the present invention.

FIG. 6 shows a second further schematic representation of the exposed at least one first channel structure 167 and the exposed plurality of media passage structures 140 with the associated plurality of anchoring structures 175 and the associated anchored channel covers. The lower half of the figure shows the cross-sectional view. In contrast to the representation in FIG. 5, a segment has at least one connection channel 195 to adjacent segments of the plurality of segments 194. Additionally, the possible flow directions of the medium 15 in the direction of the access 189 of the at least one second channel structure 170 vary in comparison to FIG. 5 in consequence of the different designs of the connection channels 194.

Figure 7A:
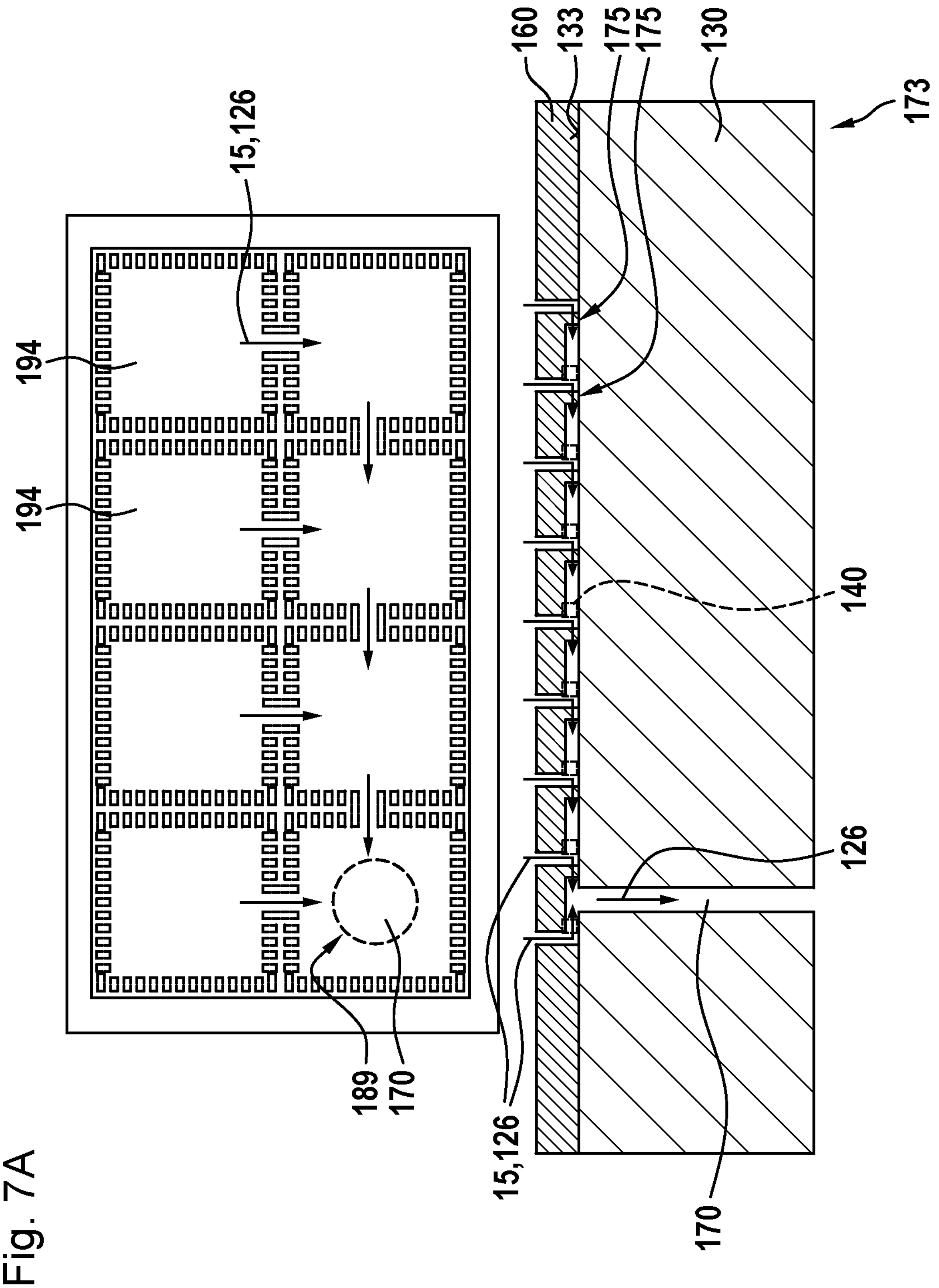
FIG. 7A shows a third further schematic representation of an exposed at least one first channel structure and/or of an exposed plurality of media passage structures, according to an example embodiment of the present invention.

FIG. 7A shows a third further schematic representation of the exposed at least one first channel structure 167 and the exposed plurality of media passage structures 140 with the associated plurality of anchoring structures 175 and the associated anchored channel covers. The lower half of the figure shows the cross-sectional view. In contrast to the preceding representations, the design of the connection channels 194 and the possible flow directions of the medium 15 in the direction of the access 189 of the at least one second channel structure 170 vary.

Figure 7B:
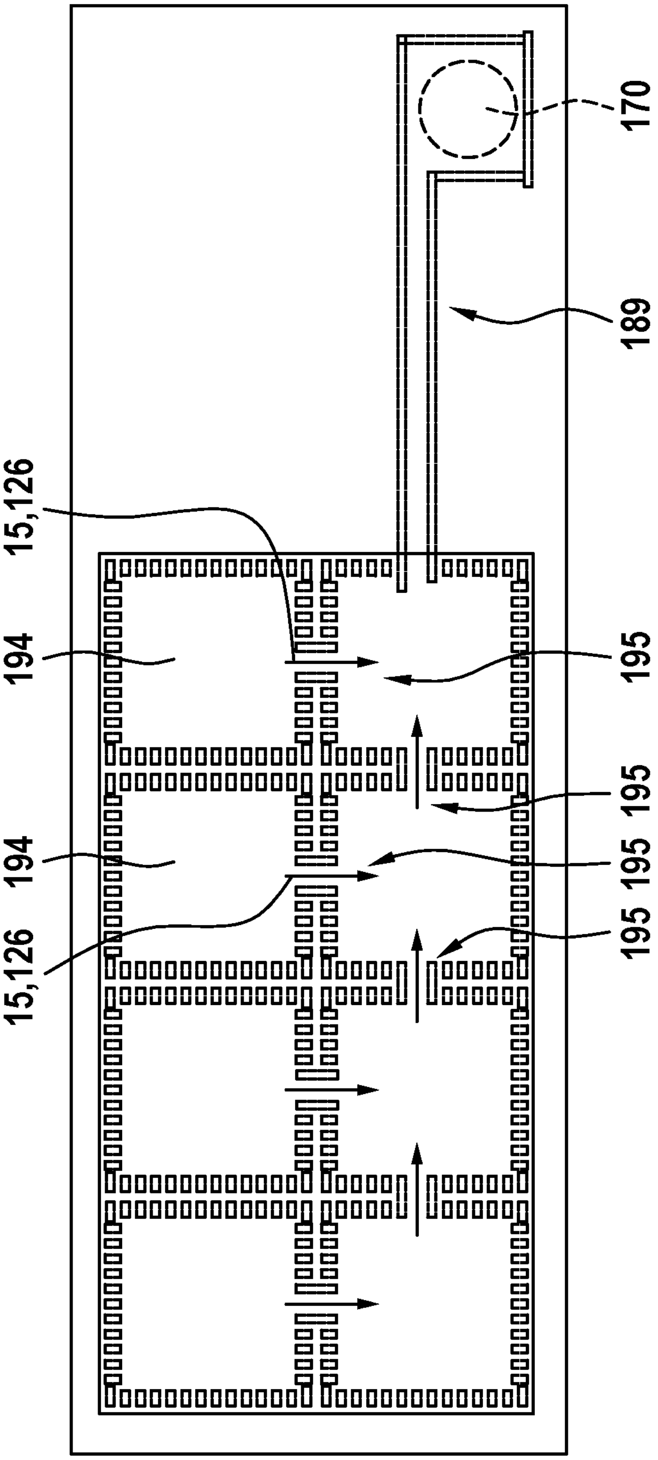
FIG. 7B shows a fourth further schematic representation of an exposed at least one first channel structure and/or of an exposed plurality of media passage structures, according to an example embodiment of the present invention.

FIG. 7B shows a fourth further schematic representation of the exposed at least one first channel structure 167 and the exposed plurality of media passage structures 140 with the associated plurality of anchoring structures 175 and the associated anchored channel covers. In contrast to the preceding representations, the design of the connection channels 194 and the possible flow directions of the medium 15 in the direction of the access 189 of the at least one second channel structure 170 vary. A further distinguishing feature is the access 189 to the at least one second channel structure 170 and also the position, i.e., placement, of the at least one second channel structure 170, wherein the access 189 is designed as at least one separate or at least one external access channel and opens into at least one segment 194 of the plurality of segments 194, and the at least one second channel structure 170 is designed as a separate or external second channel structure and is arranged outside of a segment 194 and/or outside of the plurality of segments 194.

Figure 8:
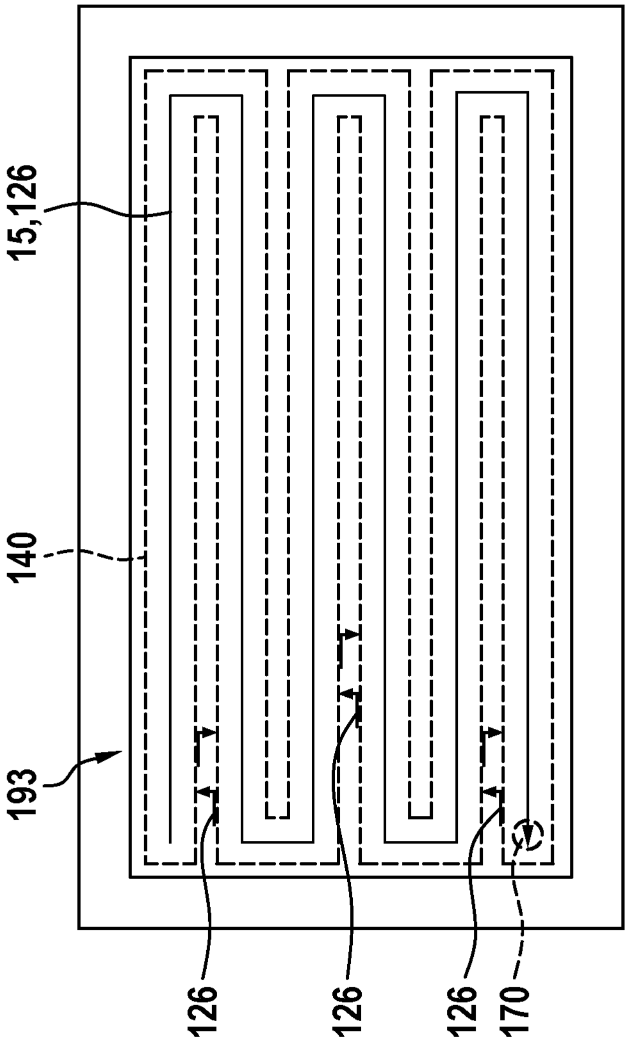
FIG. 8 shows a fifth further schematic representation of an exposed at least one first channel structure and/or of an exposed plurality of media passage structures, according to an example embodiment of the present invention.

FIG. 8 shows a fifth further schematic representation of the at least one first channel structure 167, which has been exposed in the fifth step 125, and the exposed plurality of media passage structures 140 with the associated plurality of anchoring structures 175 and the associated anchored channel covers, which have an essentially meandering course 193. A possible flow direction of the medium 15 in the direction of the at least one second channel structure 170 also has such a course.

By providing a plurality of media passage structures 140 in at least one partial region of a wall/of a lateral boundary of at least one first channel structure 167 provided with a cover made of material of the first polysilicon layer 160, it can advantageously be achieved that a medium 15 can flow through at least one media passage structure 140 of the plurality of media passage structures 140 and through at least one channel structure 167 and/or through at least one connection channel structure 126 in the direction of at least one second channel structure 170 until all media passage structures are closed in a media-tight manner by foreign substances, such as particles.

Via the shape of the at least one media passage channel structure 140 of the plurality of media passage channel structures 140 and/or of the at least one first channel structure 167 and/or of the at least one segment 194 and/or of the at least one connection channel structure 126, a large-area filter structure can advantageously be generated/produced on a relatively small area.

Figure 9:
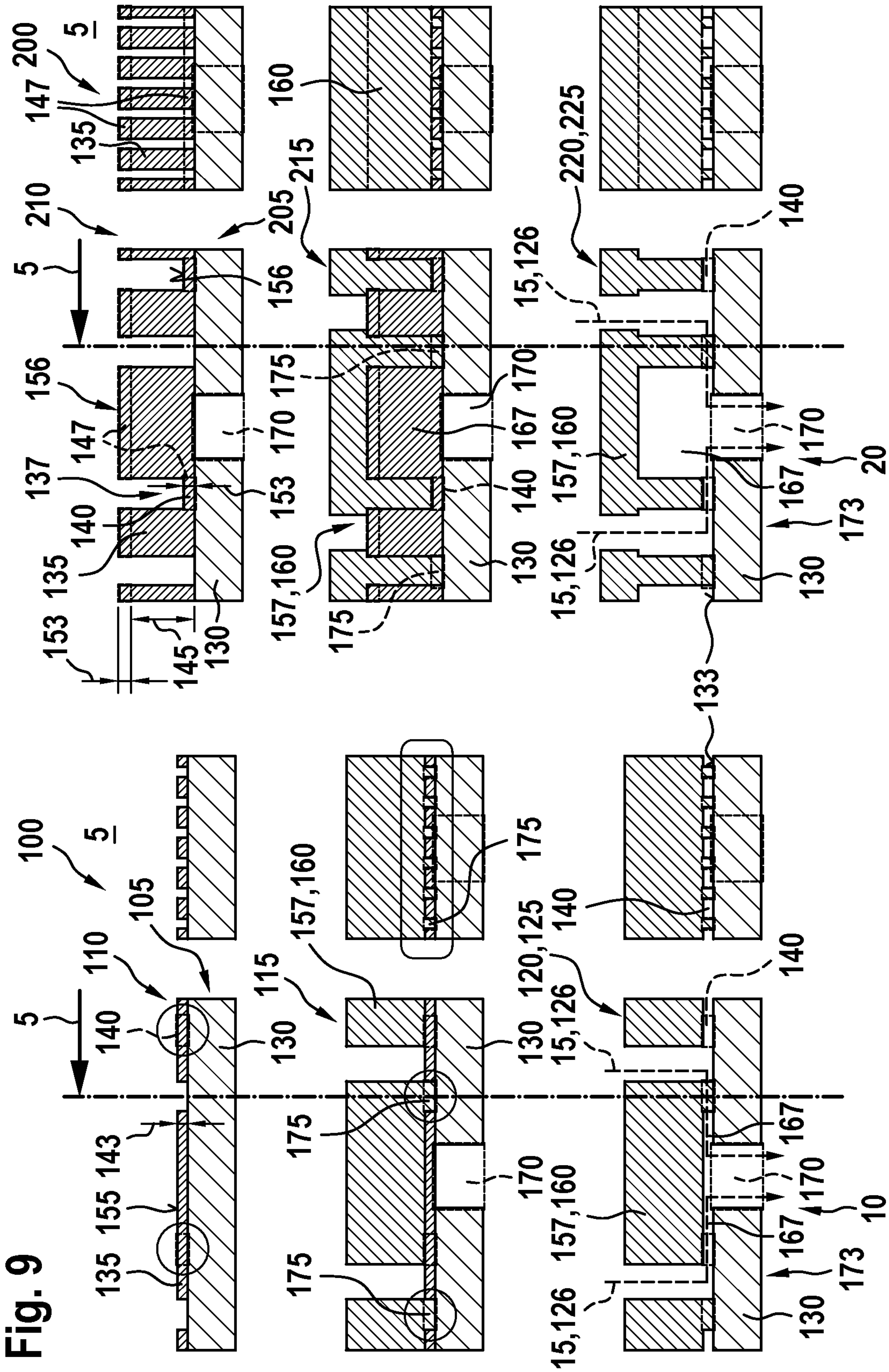
FIG. 9 shows a schematic comparison of first to fifth steps of a method for producing a particle protection element according to a first and a second embodiment of the present invention and a particle protection element according to a first and a second embodiment of the present invention.

FIG. 9 shows a schematic comparison of first to fifth steps 105-125, 205-225 of a method for producing a particle protection element according to a first and a second embodiment 100, 200, and a particle protection element 10, 20 according to a first and a second embodiment (and in each case a schematic representation of the section AB 5). The method 100 for producing the particle protection element according to the first embodiment and the particle protection element according to the first embodiment 10 are described above. The method 200 for producing the particle protection element 20 according to the second embodiment can have a similar first step 205 as explained above in connection with the production method 100 according to the first embodiment.

A second step 210 of the production method according to the second embodiment 200 comprises applying a second silicon dioxide layer 147 to the structured first silicon dioxide layer 135 and to the at least one exposed surface 133 of the substrate 130 in addition to applying the first silicon dioxide layer 135 to a surface of the substrate 133 and structuring or locally removing the first silicon dioxide layer 137. If, in the second step 210, the second silicon dioxide layer 147 is applied to the structured first silicon dioxide layer 135 and to the at least one exposed surface 133 of the substrate 130, the first silicon dioxide layer 135 will have a second settable thickness 145, which is designed to be greater than the first settable thickness 143 of the first silicon dioxide layer 135 without the applied second silicon dioxide layer 147. The second silicon dioxide layer 147 deposited onto the at least one exposed surface 133 of the substrate can be used to produce at least one media passage channel structure 140 of the plurality of media passage channel structures 140. In the method 200, the height of the later at least one media passage channel structure 140 of the plurality of media passage structures 140 can, for example, be set on the basis of a thickness 153 of the second silicon dioxide layer 147.

When the second silicon dioxide layer 147 is applied to the structured first silicon dioxide layer 135 in the second step 210, the first silicon dioxide layer 135 is only structured in regions in which the later plurality of media passage structures 140 and/or the later plurality of anchoring structures 175 are formed.

Before the deposition of the first polysilicon layer 160 in a third step 215 of the production method according to the second embodiment 200, the first silicon dioxide layer 135 and the second silicon dioxide layer 147 are structured in such a way that they are completely removed at least in one region of an anchoring structure 175 of the later plurality of anchoring structures 175. After the subsequent full-area deposition of the first polysilicon layer 160, the first polysilicon layer 160 is structured 157 in the third step 215 in such a way that, due to polysilicon-free regions in the first polysilicon layer 160, the first and second silicon dioxide layers 135, 147 can be removed for forming a later at least one first channel structure 167 and an at least one media passage channel structure 140 of the plurality of media passage channel structures 140. A fourth step 220 of the production method according to the second embodiment 200, i.e., the formation of the at least one second channel structure 170, can be designed similarly to the above-explained fourth step 120 of the production method according to the first embodiment 100.

In a fifth step 225 of the production method according to the second embodiment 200, by means of an etching process 192 (as explained above) via an access through the first polysilicon layer 160 outside of the cover of the at least one channel structure 167 consisting of material of the first polysilicon layer 160, the first silicon dioxide layer 135 and/or the second silicon dioxide layer 147 can be removed outside of the at least one channel structure 167 and/or within the at least one channel structure 167 and/or in the region of at least one media passage structure 140 of the plurality of media passage structures 140. Additionally or alternatively, the fifth step 225 may also comprise removing the first silicon dioxide layer 135 and the second silicon dioxide layer 147 by means of an etching process 192 via the formed at least one second channel structure 170 through the substrate 130 starting from the rear side 173 of the substrate 130. The structure of the particle protection element 20 can thus vary in consequence of the slightly modified production process 200 in comparison to the particle protection element 10 according to the first embodiment and can advantageously, for example, provide a larger channel cross section which is independent of the choice of a thickness of a silicon dioxide layer 135, 147 which determines the height of a later at least one media passage structure 140 of the plurality of media passage structures 140.

Figure 10:
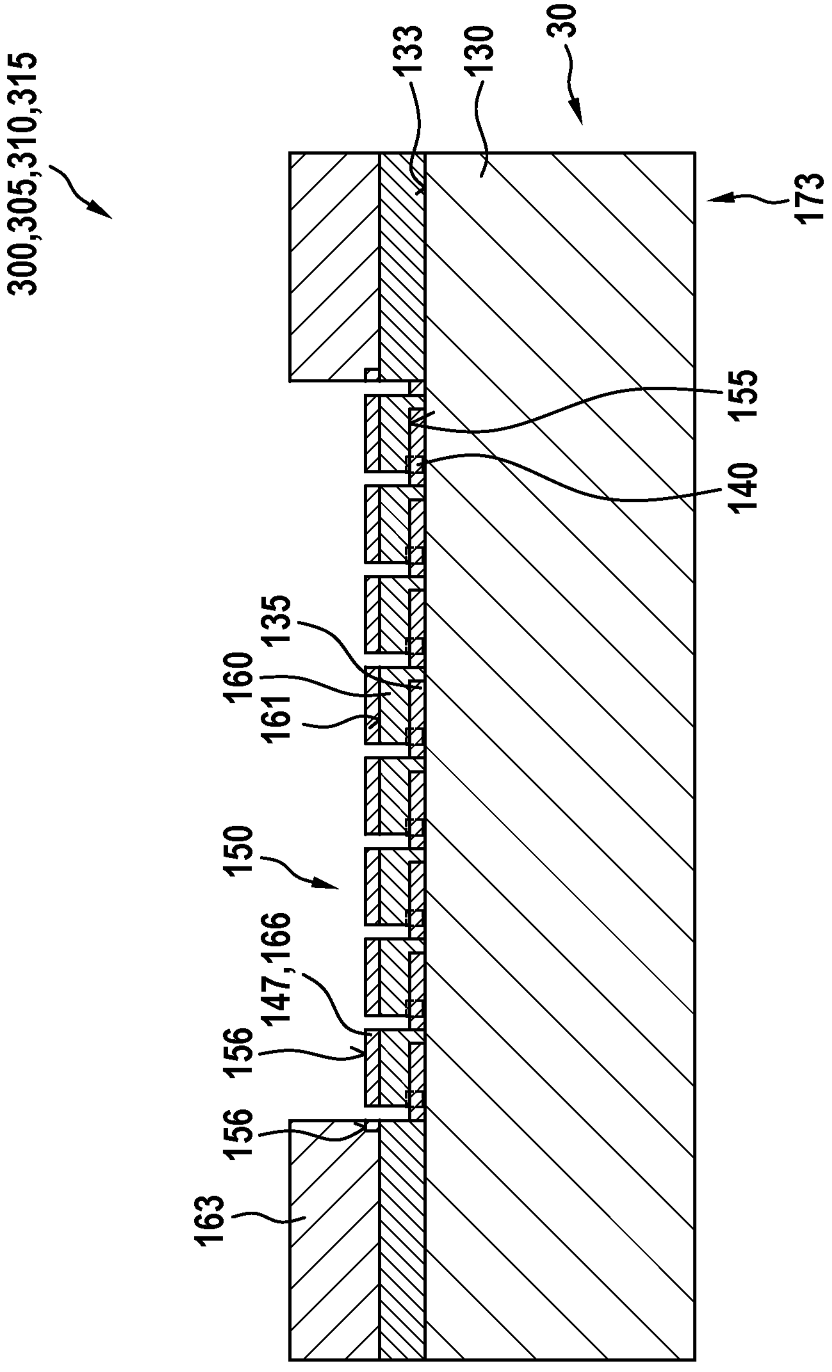
FIG. 10 shows a schematic representation of a method for producing a particle protection element according to a third embodiment of the present invention and an intermediate state of a particle protection element according to a third embodiment of the present invention.

FIG. 10 shows a schematic representation of a method 300 for producing a particle protection element 30 according to a third embodiment and also the intermediate state of a later particle protection element 30 according to a third embodiment. In this case, the first step 305 of the production method 300 according to the third embodiment can be designed similarly to the first step 105, 205 of the production method according to the first embodiment 100 or of the production method according to the second embodiment 200. The second step 310 of the production method 300 according to the third embodiment can be designed similarly to the second step 110 of the production method according to the first embodiment 100 or similarly to the second step 210 of the production method according to the second embodiment 200.

In contrast to the preceding methods 100, 200, a third step 315 of the production method 300 may comprise applying a second polysilicon layer 163 to the surface 156 of the second silicon dioxide layer 147 in addition to depositing the first polysilicon layer 160 onto the surface 155 of the first silicon dioxide layer 135 and the surface 133 of the substrate 130 and applying the second silicon dioxide layer 147 to the surface 161 of the first polysilicon layer 160 and structuring 150 it. Furthermore, the third step 315 of the production method 300 may comprise structuring the first polysilicon layer 160 and/or structuring 166 the second polysilicon layer 163, wherein the structured second silicon oxide layer 147 can be used at least in regions as an etching mask for the first polysilicon layer 160 and for forming the cover of the at least one first channel structure 167 from material of the first polysilicon layer 160, and wherein the etching process used for structuring the first and/or second polysilicon layer 160, 163 preferably stops at the first and/or second silicon dioxide layer 135, 147. Additionally, the third step 315 may also comprise removing the first silicon dioxide layer 135 for forming a later at least one first channel structure 167 and/or for forming at least one media passage structure 140 of the plurality of media passage structures 140, and removing the etching mask comprising the material of the second silicon dioxide layer 147.

A fourth step 320 of the production method according to the third embodiment 300, i.e., the formation of the at least one second channel structure 170, can be designed similarly to the above-explained fourth step 120, 220 of the production method according to the first embodiment 100 or according to the second embodiment 200 but is not shown in FIG. 10.

The fifth step 325 of the production method 300 is not shown in FIG. 10 but can take place for producing the particle protection element 30 similarly to what has been described above in connection with the production method according to the first embodiment 100 or the second embodiment 200.

Figure 11:
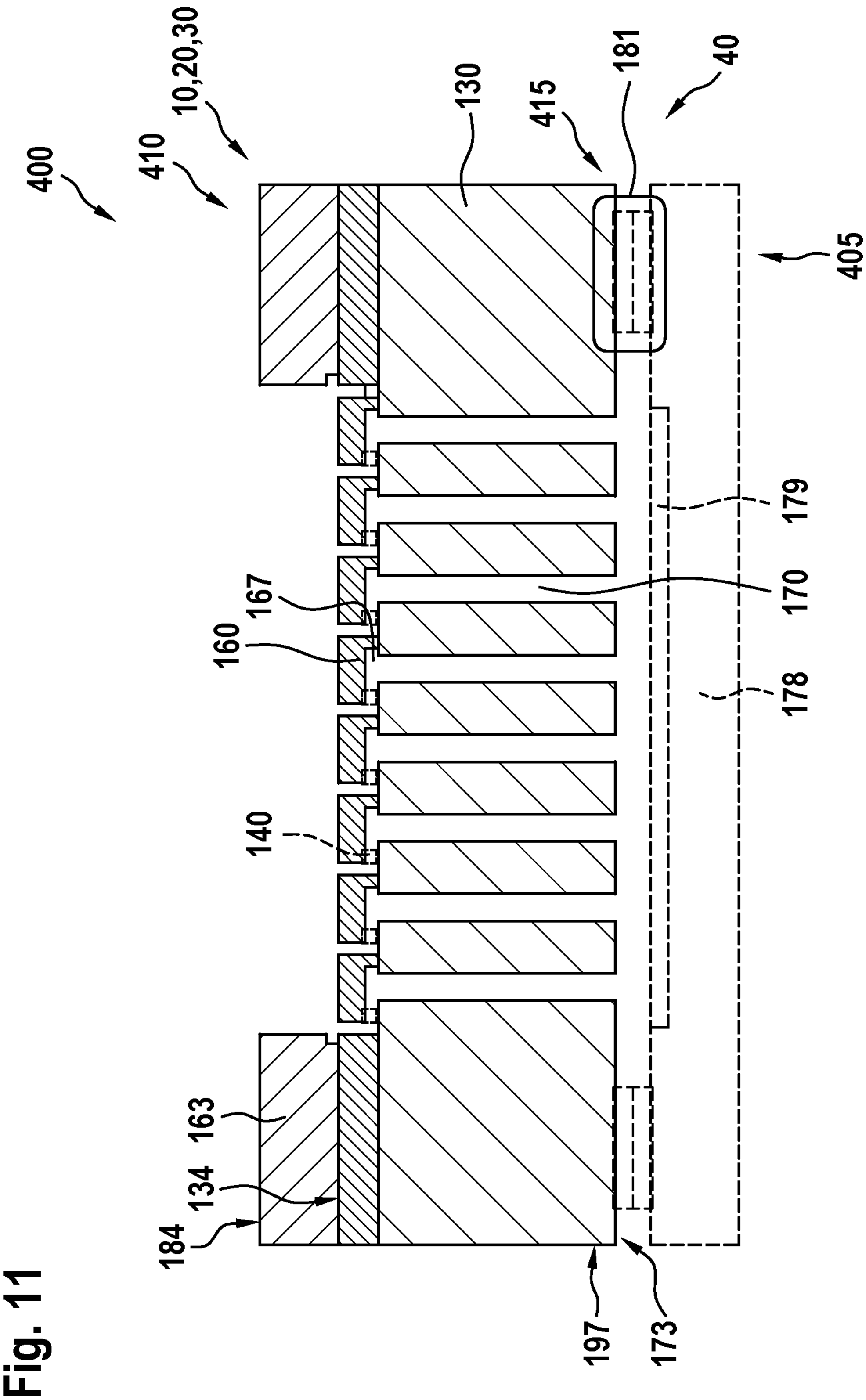
FIG. 11 shows a schematic representation of a method for producing a pressure sensor according to a first embodiment of the present invention and a pressure sensor according to a first embodiment of the present invention.

FIG. 11 shows a schematic representation of a method 400 for producing a pressure sensor according to a first embodiment and a pressure sensor according to a first embodiment 40. In a first step 405, the method 400 for producing the pressure sensor 40 comprises providing a further substrate 178 which is designed as a pressure sensor element and has a membrane 179. A second step 410 of the method 400 comprises providing a particle protection element 10, 20, 30 for the membrane 179 of the further substrate 178 designed as a pressure sensor element. The particle protection element 10, 20, 30 has in this case been produced according to one of the aforementioned production methods 100, 200, 300. In a third step 415, the further substrate 178 and the particle protection element 10, 20, 30 are connected to one another by means of a bonding method, preferably by means of a wafer bonding method, and/or by means of an adhesive method. In this case, the further substrate 178 and the particle protection element 10, 20, 30 are connected by means of a bonding method and/or by means of an adhesive method in the third step 415 in such a way that bond areas/bond structures and/or adhesive areas/adhesive structures 181 are arranged on the rear side 173 of the substrate 130 of the particle protection element 10, 20, 30 and/or on corresponding points on the side of the further substrate 178 designed as a pressure sensor element on which the membrane 179 is located.

Figure 12:
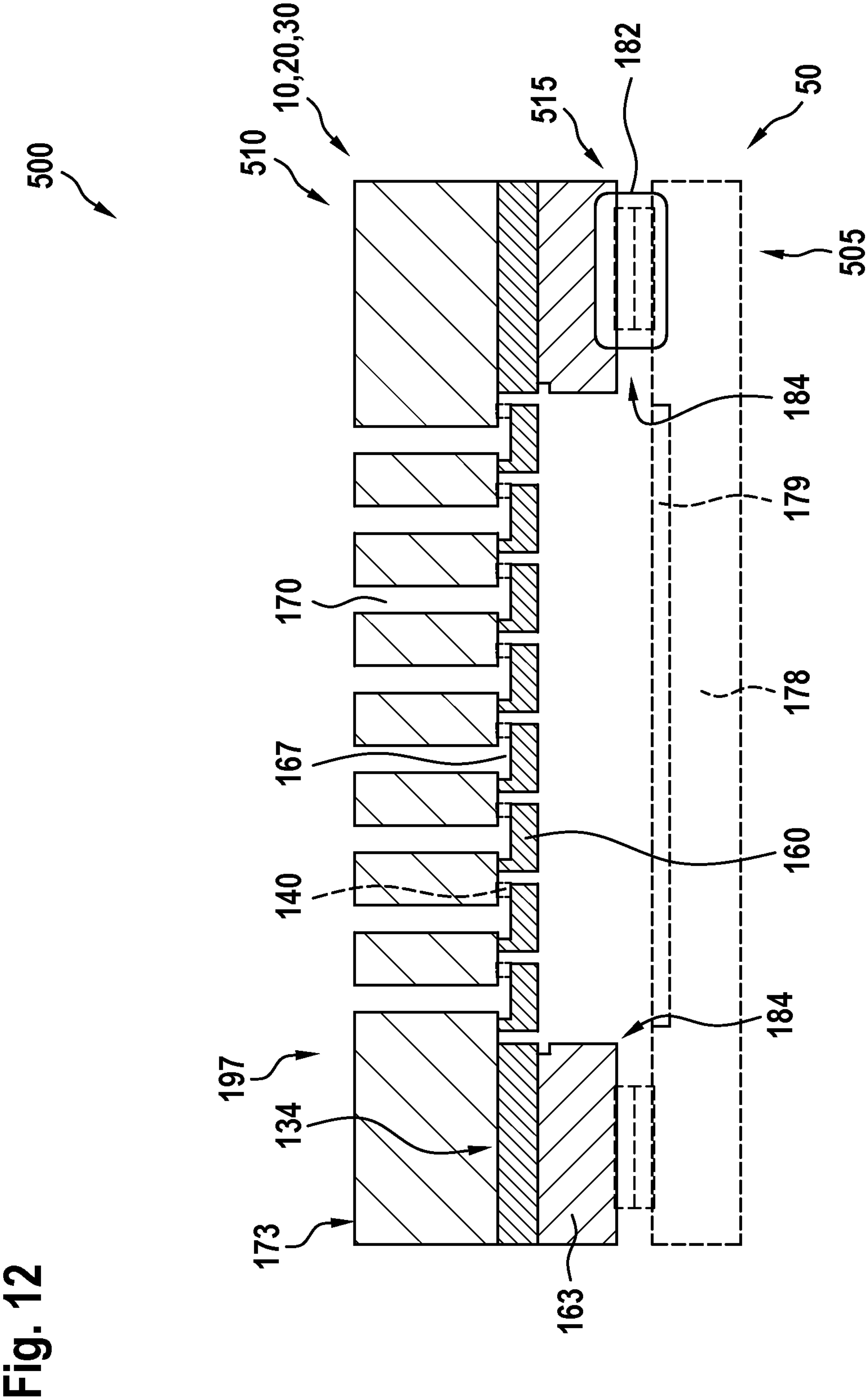
FIG. 12 shows a schematic representation of a method for producing a pressure sensor according to a second embodiment of the present invention and a pressure sensor according to a second embodiment of the present invention.

FIG. 12 shows a schematic representation of a method 500 for producing a pressure sensor according to a second embodiment and a pressure sensor 50 according to a second embodiment. A first and a second step 505, 510 can be designed similarly to the first and second steps 405, 410 in FIG. 11. In contrast to the representation in FIG. 11, the further substrate 178 and the particle protection element 10, 20, 30 can be connected by means of a bonding method and/or by means of an adhesive method in the third step 515 in such a way that bond areas and/or adhesive joints 182 are arranged on a front side 184 of the particle protection element 10, 20, 30.

Figure 13:
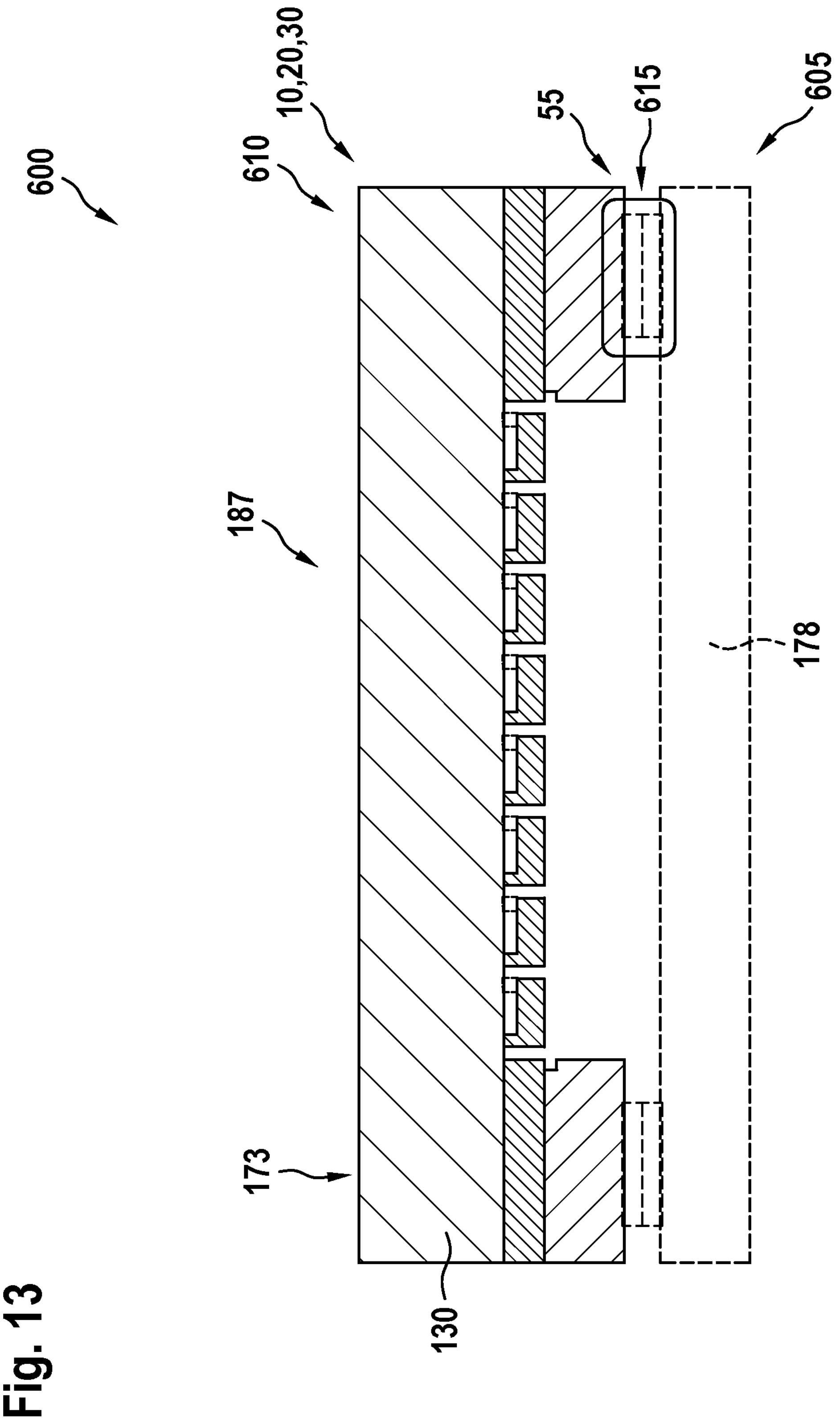
FIG. 13 shows a schematic representation of a method for producing a pressure sensor according to a third embodiment of the present invention and an intermediate state of a pressure sensor according to a third embodiment of the present invention.

FIG. 13 shows a schematic representation of a method 600 for producing a pressure sensor according to a third embodiment and the intermediate state of a pressure sensor 55 according to a third embodiment. A first and a second step 605, 610 are designed similarly to the above explanation. A third step 615 can here comprise the further substrate 178 and the particle protection element 10, 20, 30 being first connected before a formation of the later at least one second channel structure 170 through the substrate 130 from the rear side 173 of the substrate 130 during the production 100, 200, 300 of the particle protection element 10, 20, 30 in the fourth step 120, 220, 320. Additionally, before the formation of the at least one second channel structure 170 through the substrate 130, the rear side 173 of the substrate 130 can be removed 187 and a thickness of the substrate 130 can be reduced. Forming the at least one second channel structure 170 from the rear side 173 of the substrate furthermore comprises providing a mask, in particular a photoresist mask 177 and/or a silicon dioxide hard mask 180, on the rear side 173 of the substrate 130 so that the later at least one second channel structure 170 through the substrate 130 can be formed.

Figure 14:
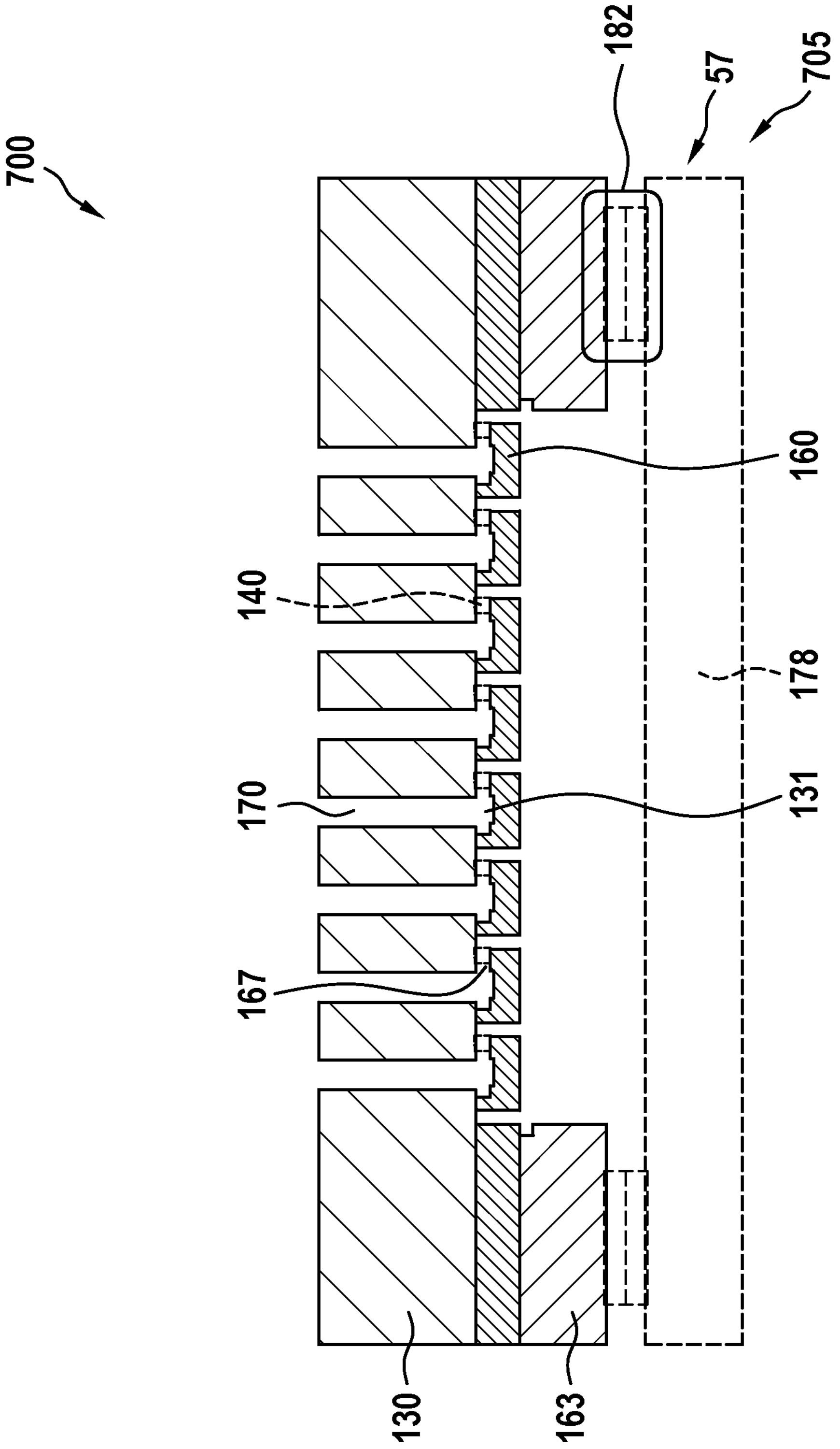
FIG. 14 shows a schematic representation of a method for producing a pressure sensor according to a fourth embodiment of the present invention and a pressure sensor according to a fourth embodiment of the present invention.

FIG. 14 shows a schematic representation of a method 700 for producing a pressure sensor according to a fourth embodiment and a pressure sensor 57 according to a fourth embodiment. A first to third method step 705, 710, 715 of the method 700 can be designed similarly to the above explanation of the methods for producing a pressure sensor according to the first to third embodiments 400, 500, 600. The method 700 or the pressure sensor 57 in FIG. 14 can differ from methods 400, 500, 600 described above in that, during the formation of the at least one second channel structure 170 from the rear side 173 of the substrate 130 through the substrate 130, slight etching 131 in the first polysilicon layer 160 can occur due to a missing etch stop structure 191 having, for example, material of the first and/or second silicon dioxide layer 135, 147.

Figure 15:
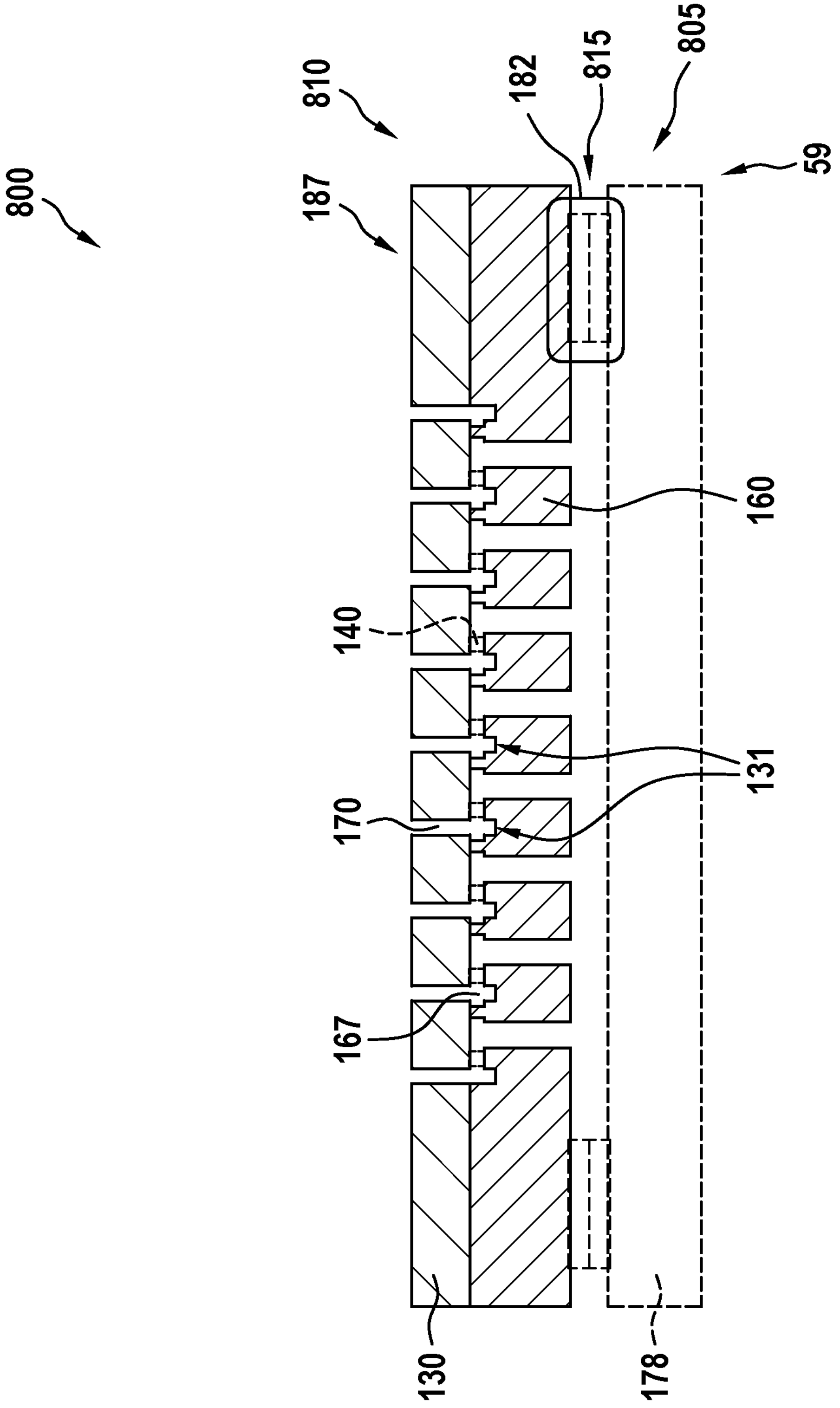
FIG. 15 shows a schematic representation of a method for producing a pressure sensor according to a fifth embodiment of the present invention and a pressure sensor according to a fifth embodiment of the present invention.

FIG. 15 shows a schematic representation of a method 800 for producing a pressure sensor according to a fifth embodiment and a pressure sensor 59 according to a fifth embodiment. A first to third method step 805, 810, 815 of the method 800 can be designed similarly to the above explanation of the methods for producing a pressure sensor according to the first to fourth embodiments 400, 500, 600, 700. The method 800 or the pressure sensor 59 in FIG. 14 can differ from the method 700 or the pressure sensor 57 in FIG. 14 in that the substrate 130 is removed 187 before the application of a photoresist mask 177 and/or before the application of a silicon dioxide hard mask 180 to the rear side 173 of the substrate 130, and in that the later at least one second channel structure 170 through the substrate 130 is only formed thereafter. During the formation of the later at least one second channel structure 170, slight etching 131 can occur in the first polysilicon layer 160, similarly to FIG. 14. By providing a sufficiently thick first polysilicon layer 160, it can be prevented that, in a production process of the at least one second channel structure 170 through the substrate 130, the at least one second channel structure 170 does not completely penetrate the first polysilicon layer 160, whereby, for example, undesirably large particles can be prevented from reaching a region between a front side 184 of the particle protection element 10, 20, 30 and the membrane 179 of the further substrate 178 designed as a pressure sensor element.

Figure 16A:
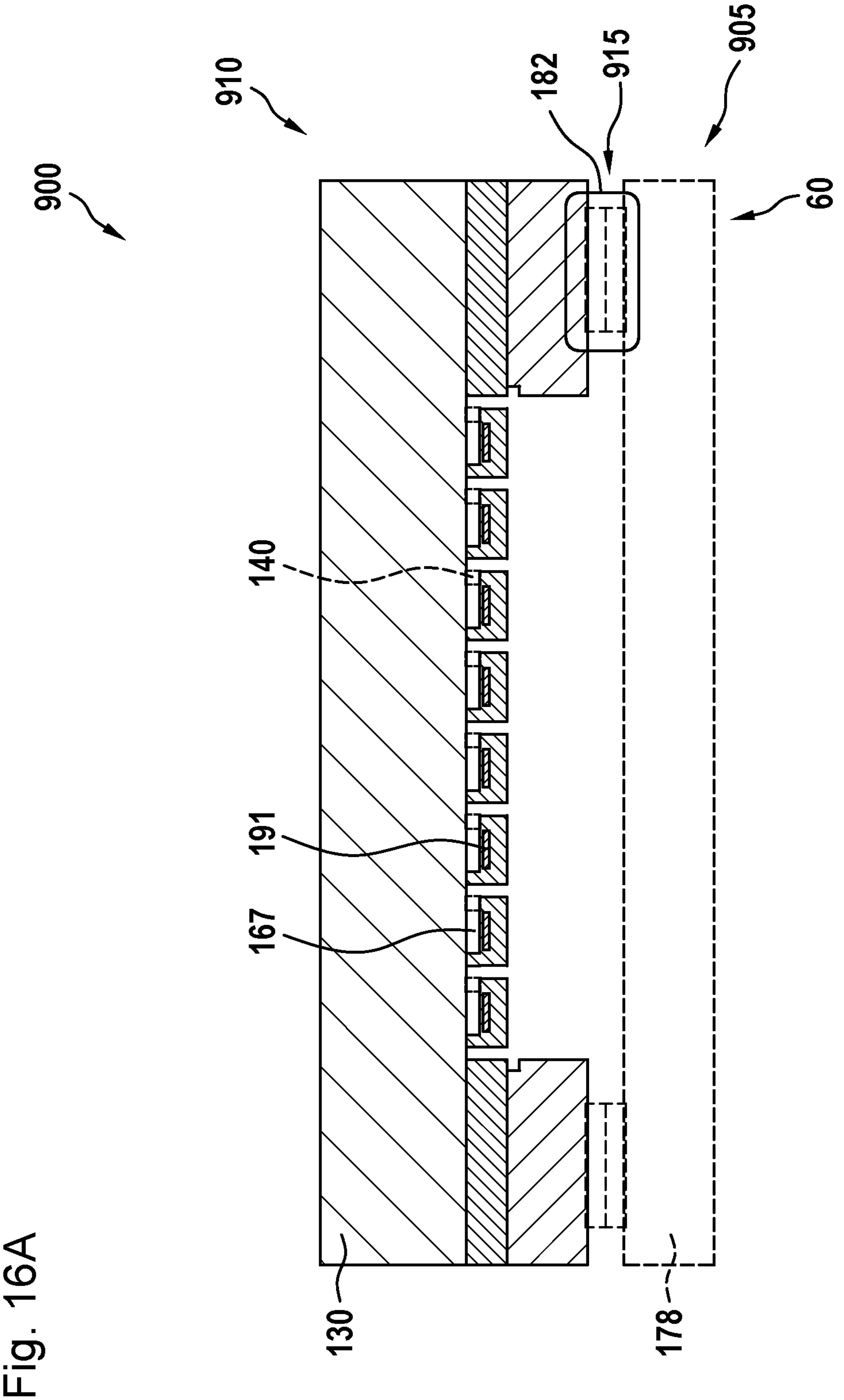
FIG. 16A shows a schematic representation of a method for producing a pressure sensor according to a sixth embodiment of the present invention and an intermediate state of a pressure sensor according to a sixth embodiment of the present invention.
Figure 16B:
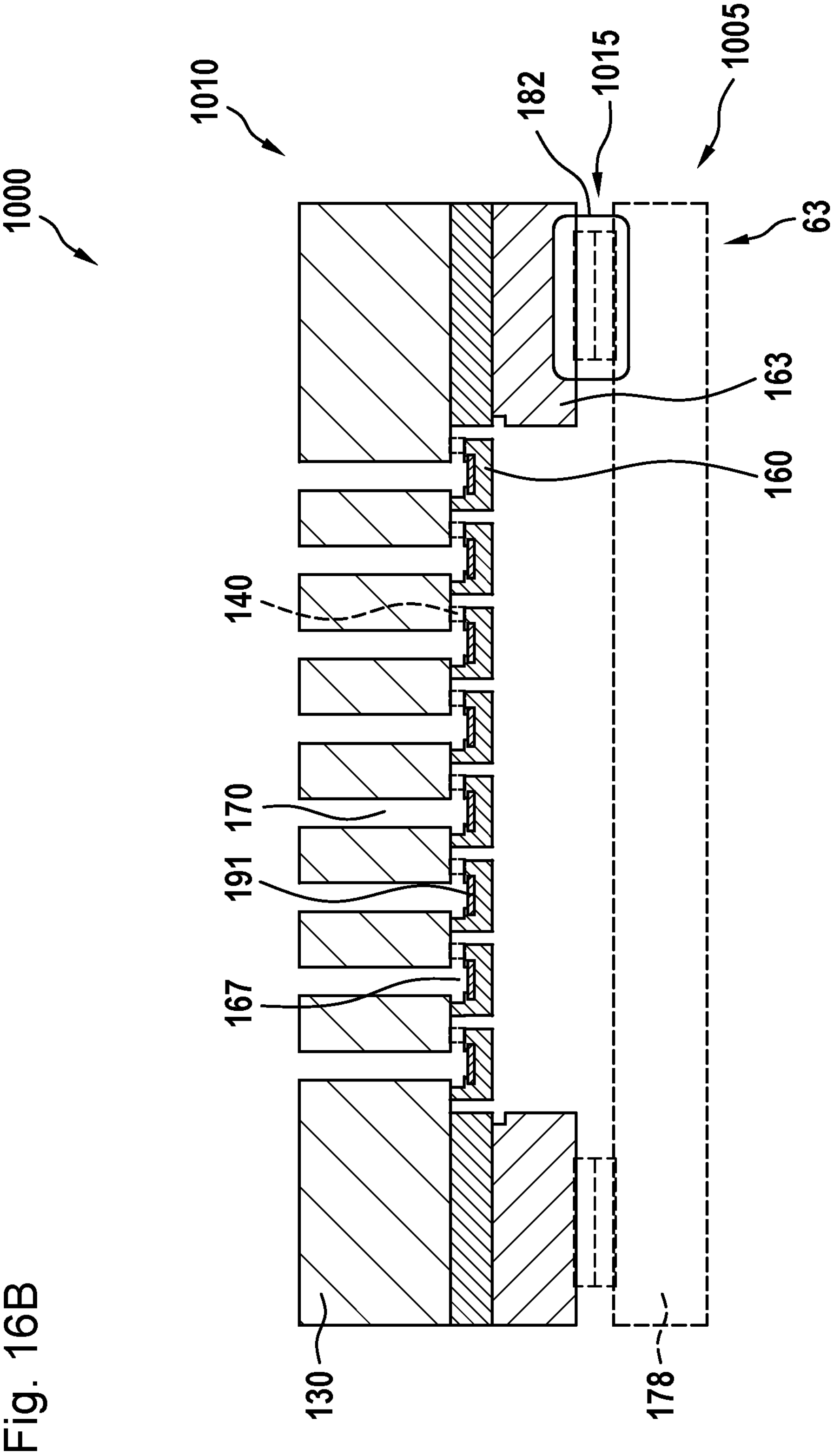
FIG. 16B shows a schematic representation of a method for producing a pressure sensor according to a seventh embodiment of the present invention and a pressure sensor according to a seventh embodiment of the present invention.

In the following, FIGS. 16A and 16B are described together. FIG. 16A shows a schematic representation of a method 900 for producing a pressure sensor according to a sixth embodiment, and the intermediate state of a pressure sensor 60 according to a sixth embodiment—before the formation of the at least one second channel structure 170—and FIG. 16B shows a schematic representation of a method 1000 for producing a pressure sensor according to a seventh embodiment and a pressure sensor 63 according to a seventh embodiment—with the finished at least one second channel structure 170. The individual first to third steps 905-915, 1005-1015 can be designed similarly to the above explanation of the methods for producing a pressure sensor according to the first to fifth embodiments 400, 500, 600, 700, 800.

In both figures, regions/structures made of, e.g., silicon dioxide are embedded in the first polysilicon layer 160 and, during the formation of the at least one second channel structure 170 from the rear side 173 of the substrate 130 through the substrate 130, serve as etch stop structures 191 and can reliably prevent through-etching of the first polysilicon layer 160.

Figure 17A:
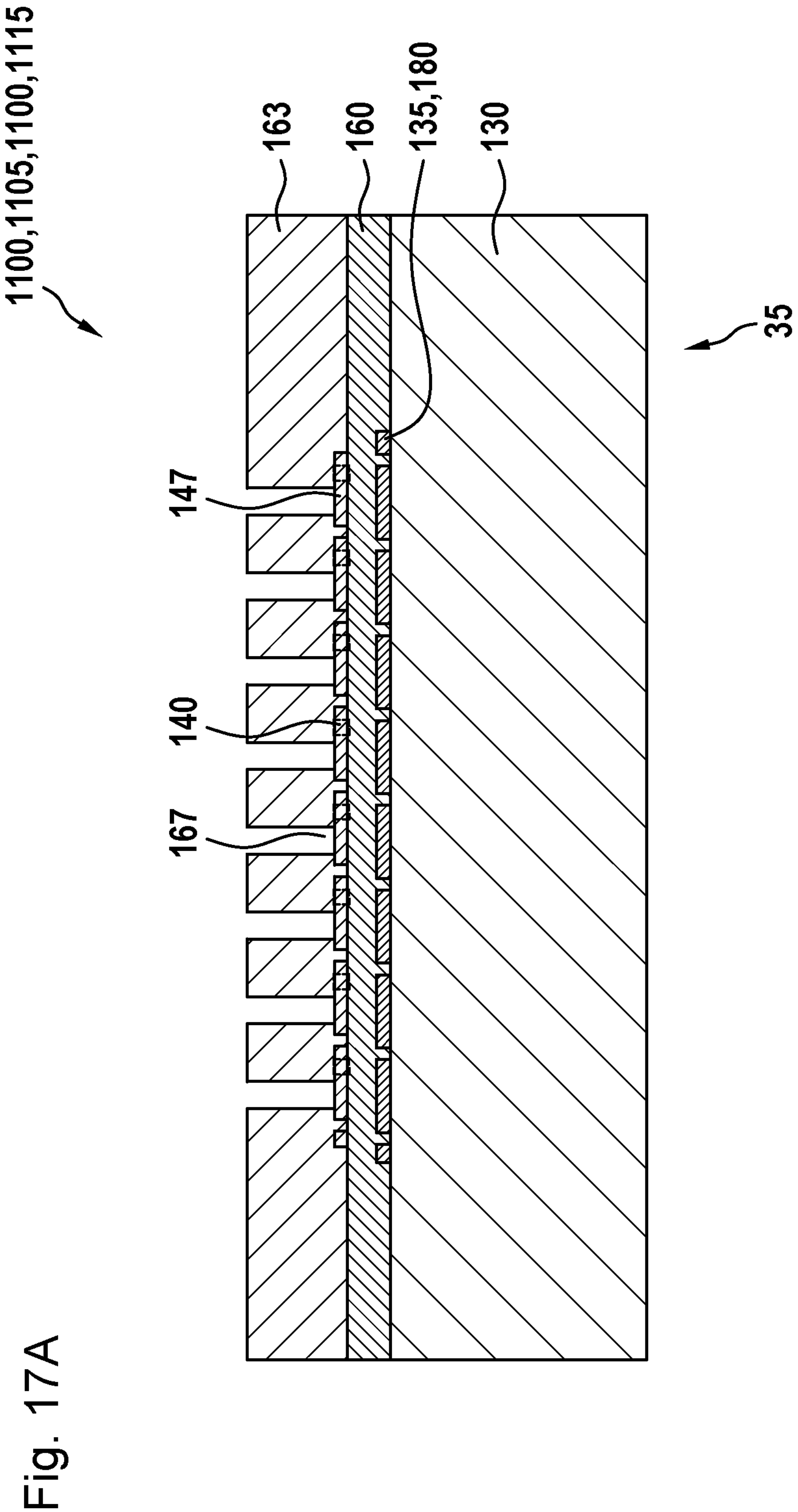
FIG. 17A shows a schematic representation of a method for producing a particle protection element according to a fourth embodiment of the present invention and an intermediate state of a particle protection element according to a fourth embodiment of the present invention.
Figure 17B:
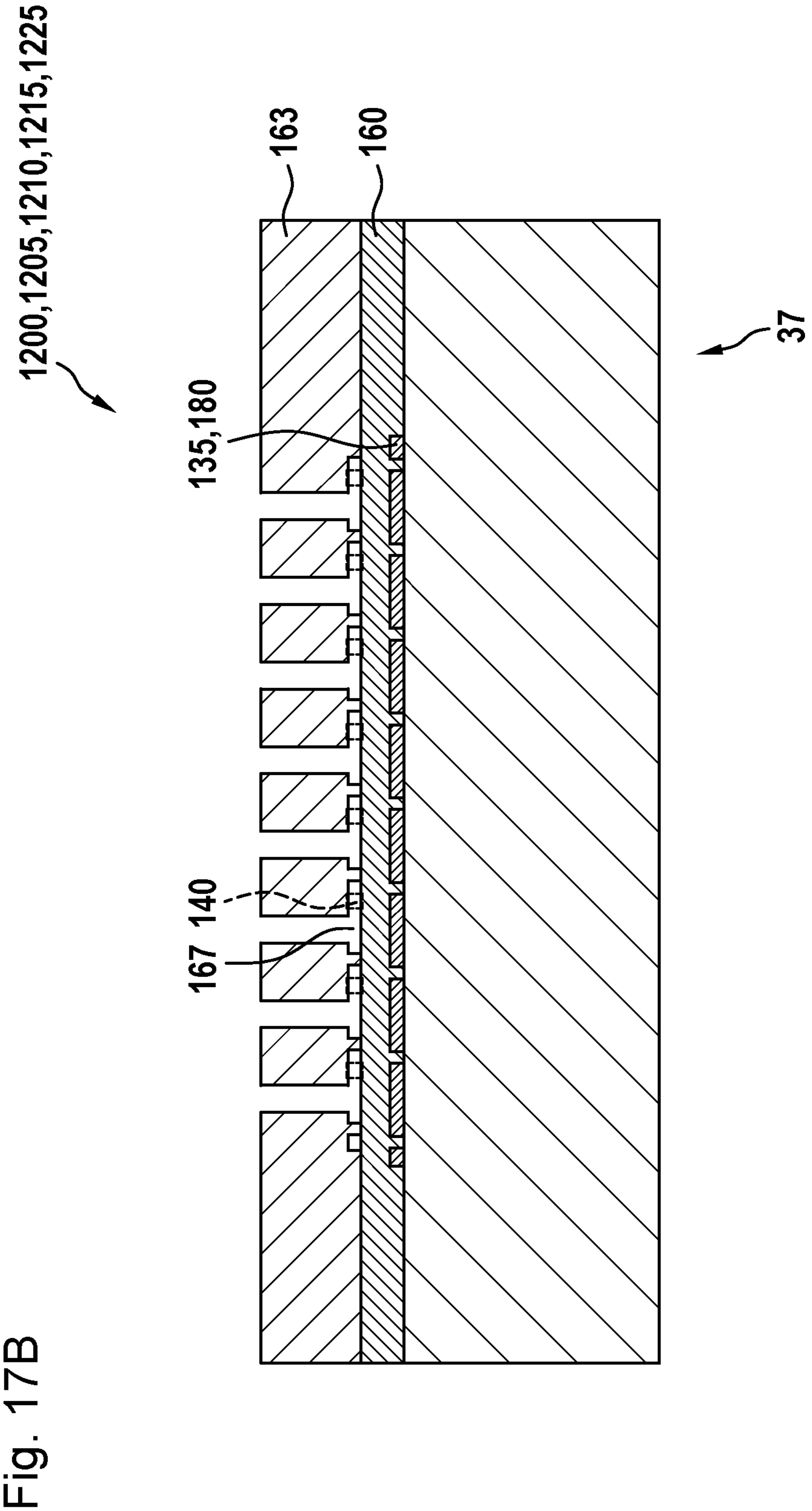
FIG. 17B shows a schematic representation of a method for producing a particle protection element according to a fifth embodiment of the present invention and a further intermediate state for a particle protection element according to a fifth embodiment of the present invention.

In the following, FIGS. 17A and 17B are described together. FIG. 17A shows a schematic representation of a method 1100 for producing a particle protection element according to a fourth embodiment and an intermediate state for a particle protection element 35 according to a fourth embodiment, and FIG. 17B shows a schematic representation of a method 1200 for producing a particle protection element according to a fifth embodiment and a further intermediate state for a particle protection element 37 according to a fifth embodiment. The first to fifth method steps 1105-1125, 1205-1225 can be designed similarly to the above explanation of the method for producing a particle protection element according to a first to third embodiment 100, 200, 300; in particular, the fourth method step 1120, 1220, i.e., the formation of the second channel structure 170, may not be shown in FIGS. 17A and 17B. Of course, the fourth method step 1120, 1220 can likewise be implemented. This is shown, for example, in the representation in FIG. 18. In both FIGS. 17A and 17B, the first silicon dioxide layer 135 is in each case used as a silicon dioxide hard mask 180, i.e., as a buried hard mask, and the second silicon dioxide layer 147 is used/provided for producing at least one first channel structure 167 and/or for producing a media passage structure 140 of the plurality of media passage structures 140.

As shown in FIGS. 17A and 17B, in contrast to the above explanation, in the production method 1100, the second silicon dioxide layer 147 and the second polysilicon layer 163 are used to form the at least one first channel structure 167 and/or to form a media passage structure 140 of the plurality of media passage structures 140 and/or to form an anchoring structure 175 of the plurality of anchoring structures 175, wherein the two layers are provided on the side of the first polysilicon layer 160 that faces away from the substrate 130. The first polysilicon layer 160 is located in regions, i.e., partially, directly on the surface 133 of the substrate 130 and in regions, i.e., partially, directly on the surface 155 of the structured first silicon dioxide layer 135 applied directly to the surface 133 of the substrate 130. The first silicon dioxide layer 135 serves as a so-called buried hard mask for producing at least one first channel structure 167 and/or one cover spanning/covering a media passage structure 140 of the plurality of media passage structures 140 and comprising material of the first polysilicon layer 160.

The etching process during the structuring of the second polysilicon layer 163 stops at the second silicon dioxide layer 147, and the second silicon dioxide layer 147 is removed in the fifth method step 1225 in FIG. 17B at least in the region of the at least one first channel structure 167 and/or of the one media passage structure 140 of the plurality of media passage structures 140.

Figure 18:
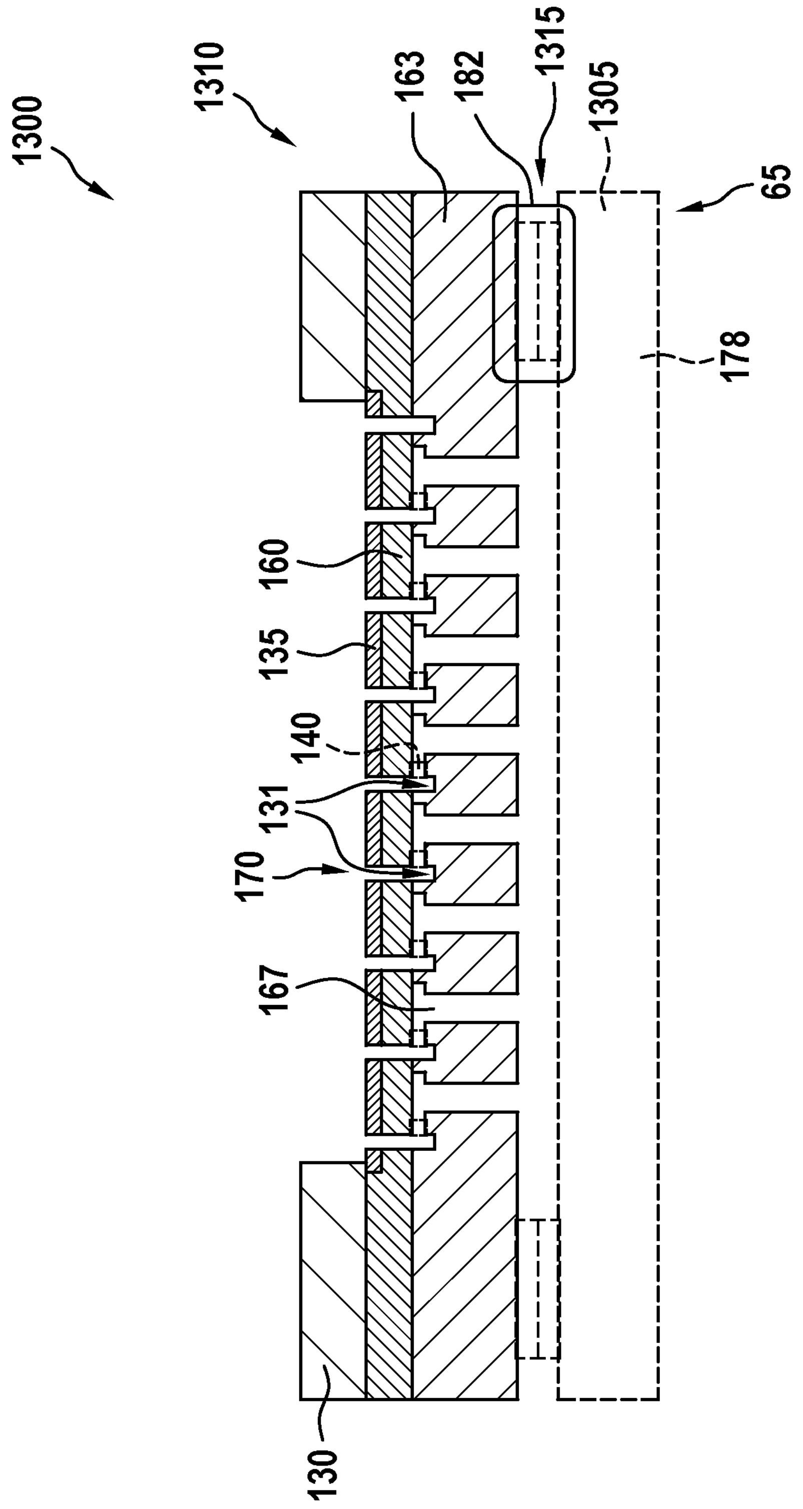
FIG. 18 shows a schematic representation of a method for producing a pressure sensor according to an eighth embodiment of the present invention and a pressure sensor according to an eighth embodiment of the present invention.

FIG. 18 shows a schematic representation of a method 1300 for producing a pressure sensor according to an eighth embodiment and a pressure sensor 65 according to an eighth embodiment. The method steps 1305-1315 can take place similarly to the above explanation. In the production method 1300 of a pressure sensor according to an eighth embodiment, after the connection, i.e., bonding, of a particle protection element produced according to a fifth embodiment, as described/shown in FIGS. 17A and 17B, to a further substrate 178, such as a pressure sensor wafer, the substrate 130 is optionally thinned and the substrate 130 is subsequently removed at least in the region of at least one second channel structure 170 in such a way that the etching process stops at the first silicon dioxide layer 135 and the first polysilicon layer 160 is also removed in regions in which the first silicon dioxide 135 has been removed. In particular, during the structuring 157 of the first polysilicon layer 160, slight etching 135 in the second polysilicon layer 163 may likewise occur.

Figure 19A:
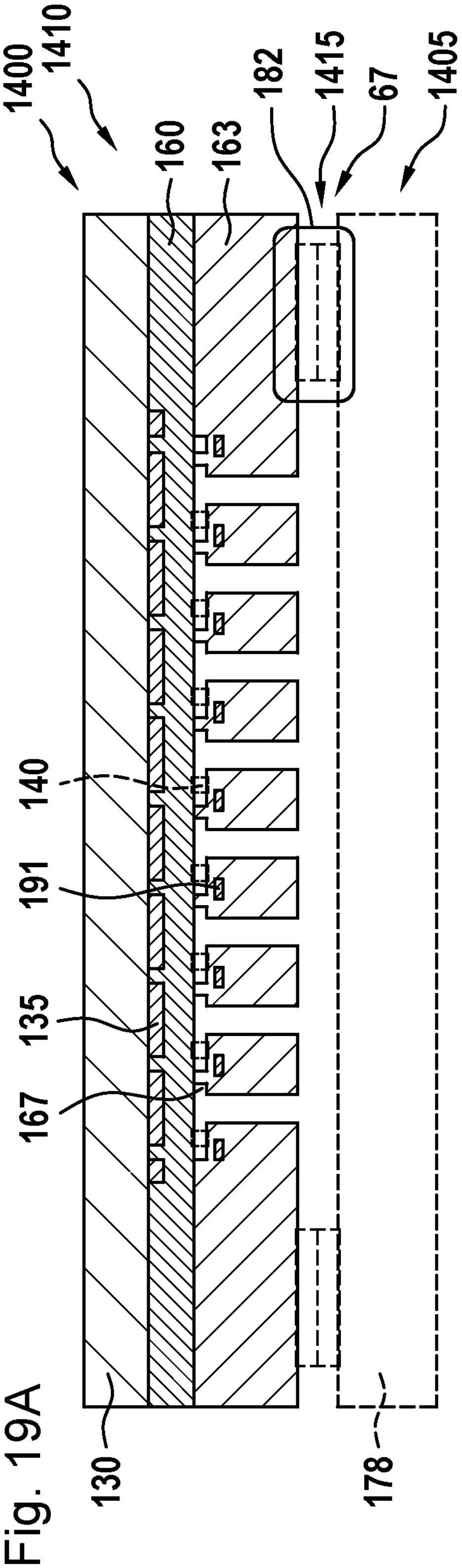
FIG. 19A shows a schematic representation of an intermediate state of a method for producing a pressure sensor according to a ninth embodiment of the present invention and a pressure sensor according to a ninth embodiment of the present invention.
Figure 19B:
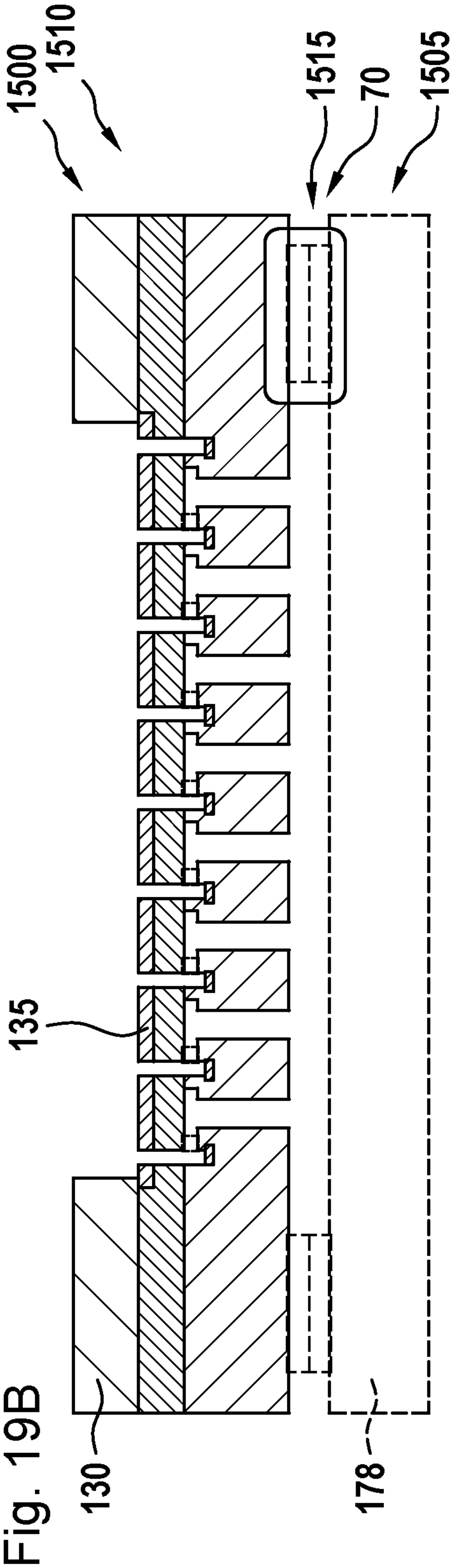
FIG. 19B shows a schematic representation of a method for producing a pressure sensor according to a tenth embodiment of the present invention and a pressure sensor according to a tenth embodiment of the present invention.

FIGS. 19A and 19B show a schematic representation of a method 1400 for producing a pressure sensor according to a ninth embodiment and a pressure sensor 67 according to a ninth embodiment as well as a schematic representation of a method 1500 for producing a pressure sensor according to a tenth embodiment and a pressure sensor 70 according to a tenth embodiment. The method steps 1405-1415, 1505-1515 can take place similarly to the above explanation of the method 1300 for producing a pressure sensor according to the eighth embodiment and of the pressure sensor 65 according to the eighth embodiment. In contrast to the preceding FIGS. 17A, 17B and 18, regions with silicon dioxide are embedded in the second polysilicon layer 163 in FIGS. 19A and 19B and serve as etch stop structures 191 during the formation of at least one media access 188 through the first polysilicon layer 160 to the later at least one first channel structure 167 and the one media passage structure 140 of the plurality of media passage structures 140.

Figure 20:
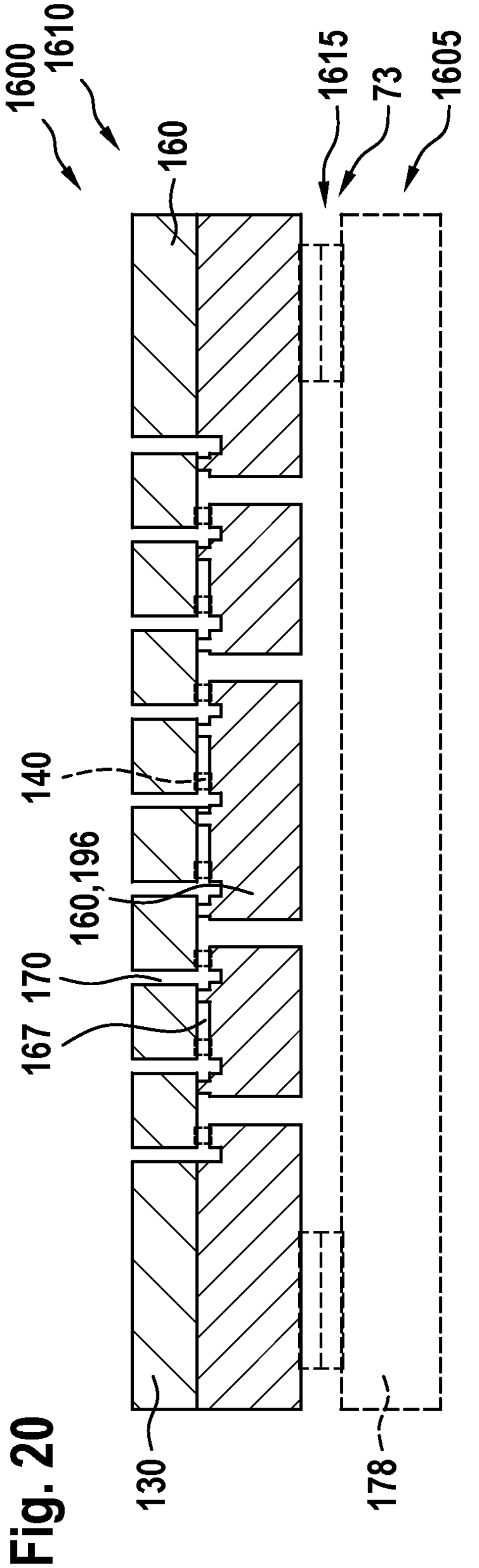
FIG. 20 shows a schematic representation of a method for producing a pressure sensor according to an eleventh embodiment of the present invention and a pressure sensor according to an eleventh embodiment of the present invention.
Figure 21:
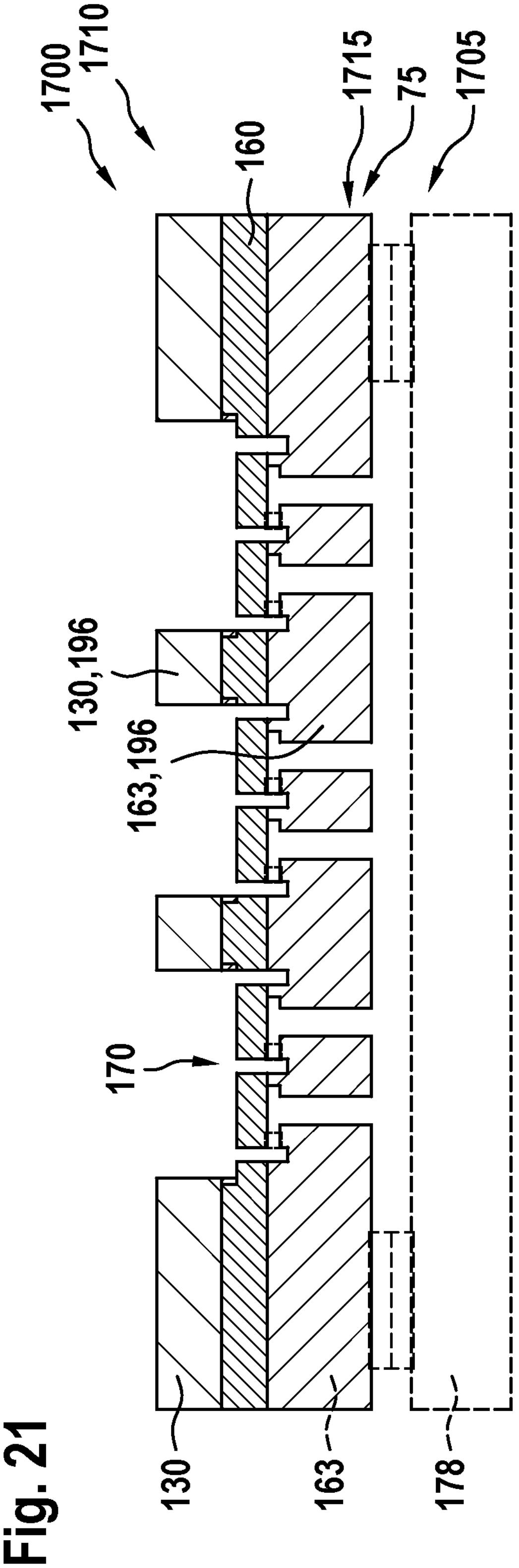
FIG. 21 shows a schematic representation of a method for producing a pressure sensor according to a twelfth embodiment of the present invention and a pressure sensor according to a twelfth embodiment of the present invention.
Figure 22:
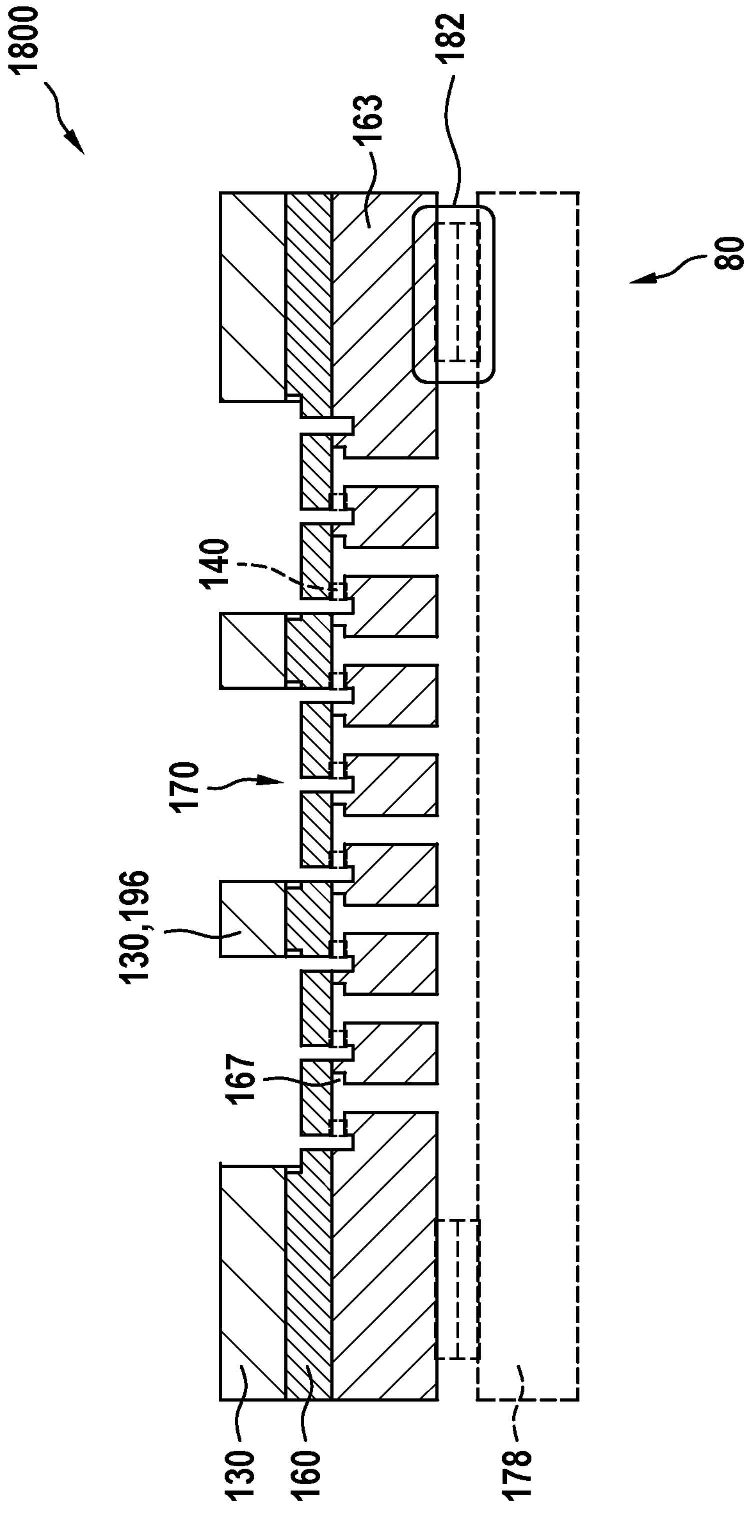
FIG. 22 shows a schematic representation of a method for producing a pressure sensor according to a thirteenth embodiment of the present invention and a pressure sensor according to a thirteenth embodiment of the present invention.

FIGS. 20 to 22 in each case show a schematic representation of a method 1600 for producing a pressure sensor according to an eleventh embodiment and a pressure sensor 73 according to an eleventh embodiment, a schematic representation of a method 1700 for producing a pressure sensor according to a twelfth embodiment and a pressure sensor 75 according to a twelfth embodiment, as well as a schematic representation of a method 1800 for producing a pressure sensor according to a thirteenth embodiment and a pressure sensor 80 according to a thirteenth embodiment. In contrast to the above explanation, during the formation of the later at least one first channel structure 167 and the one media passage structure 140 of the plurality of media passage structures 140 (FIG. 21, FIG. 22) during the structuring 157 of the first polysilicon layer 160 (FIG. 20) and/or during the structuring 165 of the second polysilicon layer 163 (FIG. 21) and/or during structuring of the substrate 130, i.e., during the formation of the at least one second channel structure 170, stiffening structures 196 are formed, wherein the stiffening structures 196 can be designed at least in portions to be contiguous and optionally separated from the surrounding substrate 130 and/or optionally separated from the surrounding first polysilicon layer 160 and/or optionally separated from the surrounding second polysilicon layer 163. Contiguous at least in portions can in this case be understood as being connected to one another via certain regions. In this case, the stiffening structures 196 can also be connected to the surrounding substrate 130 and/or the surrounding first polysilicon layer 160 and/or the surrounding second polysilicon layer 167.

For all of the aforementioned embodiments of the proposed particle protection element 10, 20, 30, 35, 37 and of the proposed pressure sensor 40, 50, 55, 57, 59, 60, 63, 65, 67, 70, 73, 75, 80, it is true without restriction that the later plurality of media passage structures 140 and/or the later at least one first channel structure 167 and/or the later at least one second channel structure 170 are in each case designed to be coatable, in particular coatable hydrophobically or hydrophilically.

It is to be understood without restriction for all explained embodiments of the figures shown that further layers can be applied to the substrate 130 and structured, and that the formation of the proposed at least one first channel structure 167 and/or the plurality of media passage structures 140 is not restricted to the explained layers or the structuring thereof. The same can apply to the formation of the at least one second channel structure 170, provided that the substrate 130 comprises embedded structures and/or materials.

It is to be understood that, for producing a planar, i.e., flat, surface, all deposited/applied layers, i.e., the first and second silicon dioxide layers 135, 147 and the first and second polysilicon layers 160, 163, as well as, where applicable, further layers for all figures can optionally be planarized by means of a polishing process/polishing step after the deposition.

The first and second polysilicon layers 160, 163 can optionally be doped without restriction, for all explained figures, in order to influence the layer stress and/or the electrical conductivity.

In addition, it is also true, without restriction, that all channels/openings/structures through the first and second silicon dioxide layers 135, 147 and/or the first and second polysilicon layers 160, 163 and/or the substrate 130 can have any geometric shape/structure.

It is furthermore to be understood that at least one opening that completely penetrates the particle protection element can be provided in the particle protection element, which opening makes possible an electrical contacting of the pressure sensor outside of the particle-protected membrane region, for example by means of a wire bonding process.

The present invention has been described in detail by means of preferred exemplary embodiments. Instead of the described exemplary embodiments, further exemplary embodiments are conceivable, which can have further modifications or combinations of described features. For this reason, the present invention is not limited by the disclosed examples since other variations can be derived therefrom by a person skilled in the art without departing from the scope of protection of the present invention.

What is claimed is:

1. A method for producing a particle protection element for a membrane of a pressure sensor, comprising the following steps:

providing a substrate in a first step;

applying a first silicon dioxide layer to a surface of the substrate and structuring the first silicon dioxide layer in a second step;

depositing a first polysilicon layer onto a surface of the first silicon dioxide layer and/or of the substrate and structuring the first polysilicon layer for forming a later at least one first channel structure in a third step, wherein a height of a later plurality of media passage structures of the particle protection element, which form a filter function with respect to penetrating particles, and/or a height of the later at least one first channel structure can be set based on a thickness of the first silicon dioxide layer; and forming a later at least one second channel structure through the substrate starting from a rear side of the substrate in a fourth step;

wherein the later at least one first channel structure and/or the later plurality of media passage structures and/or the later at least one second channel structure are configured to be connectable with regard to a media flow.

2. The method according to claim 1, wherein:

depositing and structuring the first polysilicon layer and/or the second polysilicon layer in the third step includes forming silicon dioxide regions covered with the first polysilicon layer and/or the second polysilicon layer, and/or silicon dioxide-free regions, wherein the silicon dioxide regions covered with the first polysilicon layer and/or the second polysilicon layer can later be used to form the at least one first channel structure and the plurality of media passage structures, wherein, in the silicon-dioxide-free regions, material of the first polysilicon layer and/or of the second polysilicon layer is deposited, for forming a later plurality of structure-fastening anchoring structures which serve to anchor a later cover spanning the at least one first channel structure and to form the plurality of media passage structures, and wherein a width of the later at least one first channel structure and/or a width of the later plurality of media passage structures can be set based on a distance of adjacent anchoring structures of the later plurality of anchoring structures.

3. The method according to claim 1, wherein, starting from the rear side of the substrate, substrate material is removed from the rear side of the substrate before the formation of the later at least one second channel structure.

4. The method according to claim 1, wherein regions of silicon dioxide can be embedded in the first polysilicon layer and/or in the second polysilicon layer and serve as etch stop structures when forming the later at least one first channel structure in the third step and/or when forming the later at least one second channel structure on the rear side of the substrate in the fourth step.

5. The method according to claim 1, further comprising the following step:

(i) removing the first silicon dioxide layer and/or the second silicon dioxide layer in a fifth step using an etching process via an access through the first polysilicon layer and/or the second polysilicon layer to the later at least one first channel structure and/or to the later plurality of media passage structures and/or (ii) removing the first silicon dioxide layer and/or the second silicon dioxide layer in a fifth step using an etching process via the formed at least one second channel structure on the rear side of the substrate.

6. The method according to claim 5, wherein the at least one first channel structure, which has been exposed in the fifth step, and/or the exposed plurality of media passage structures have a meandering course.

7. The method according to claim 5, wherein the at least one first channel structure, which has been exposed in the fifth step, and/or the exposed plurality of media passage structures can be arranged in the form of a plurality of segments, which can be connected using connection channels and/or include an access to the at least one second channel structure.

8. The method according to claim 1, wherein: (i) during the formation of the later at least one second channel structure and/or (ii) during the formation of the at least one first channel structure and/or the plurality of media passage structures during the structuring of the first polysilicon layer and/or of the second polysilicon layer, contiguous stiffening structures can in each case be formed at least in portions.

9. A method for producing a particle protection element for a membrane of a pressure sensor, comprising the following steps:

providing a substrate in a first step;

applying a first silicon dioxide layer to a surface of the substrate and structuring the first silicon dioxide layer and applying a second silicon dioxide layer to the structured first silicon dioxide layer and structuring the first and second silicon dioxide layers in a second step;

depositing a first polysilicon layer onto a surface of the first silicon dioxide layer and/or a surface of the second silicon dioxide layer and/or of the substrate and structuring the first polysilicon layer for forming a later at least one first channel structure in a third step, wherein a height of a later plurality of media passage structures of the particle protection element, which form a filter function with respect to penetrating particles, and/or a height of the later at least one first channel structure can be set based on a thickness of the first silicon dioxide layer and/or on a thickness of the second silicon dioxide layer; and forming a later at least one second channel structure through the substrate starting from a rear side of the substrate in a fourth step;

wherein the later at least one first channel structure and/or the later plurality of media passage structures and/or the later at least one second channel structure are configured to be connectable with regard to a media flow.

10. A method for producing a particle protection element for a membrane of a pressure sensor, comprising the following steps:

providing a substrate in a first step;

applying a first silicon dioxide layer to a surface of the substrate and structuring the first silicon dioxide layer in a second step;

depositing a first polysilicon layer onto a surface of the first silicon dioxide layer and/or onto a surface of the substrate, and applying a second silicon dioxide layer to a surface of the first polysilicon layer and applying a second polysilicon layer: (i) to a surface of the second silicon dioxide layer and/or (ii) to a surface of the first polysilicon layer, and structuring the first polysilicon layer and/or the second polysilicon layer and/or the second silicon dioxide layer for forming a later at least one first channel structure in a third step, wherein a height of a later plurality of media passage structures of the particle protection element, which form a filter function with respect to penetrating particles, and/or a height of the later at least one first channel structure, can be set based on a thickness of the first silicon dioxide layer and/or on a thickness of the second silicon dioxide layer; and forming a later at least one second channel structure through the substrate starting from a rear side of the substrate in a fourth step;

wherein the later at least one first channel structure and/or the later plurality of media passage structures and/or the later at least one second channel structure are configured to be connectable with regard to a media flow.

11. A method for producing a pressure sensor, comprising the following steps:

providing a further substrate, configured as a pressure sensor element and having a membrane, in a first step;

providing in a second step a particle protection element for the membrane of the further substrate configured as a pressure sensor element; and connecting in a third step the further substrate and the particle protection element using a bonding method;

wherein the particle protection element is produced by:

providing a substrate in another first step, applying a first silicon dioxide layer to a surface of the substrate and structuring the first silicon dioxide layer in another second step, depositing a first polysilicon layer onto a surface of the first silicon dioxide layer and/or of the substrate and structuring the first polysilicon layer for forming a later at least one first channel structure in another third step, wherein a height of a later plurality of media passage structures of the particle protection element, which form a filter function with respect to penetrating particles, and/or a height of the later at least one first channel structure can be set based on a thickness of the first silicon dioxide layer, and forming a later at least one second channel structure through the substrate starting from a rear side of the substrate in a fourth step, wherein the later at least one first channel structure and/or the later plurality of media passage structures and/or the later at least one second channel structure are configured to be connectable with regard to a media flow.

12. The method according to claim 11, wherein the further substrate and the particle protection element are connected in the third step using the bonding method in such a way that: (i) bond structures and/or adhesive areas are arranged on the rear side of the substrate of the particle protection element, and/or (ii) bond structures and/or adhesive areas are arranged on a front side of the particle protection element.

13. The method according to claim 11, wherein the further substrate and the particle protection element are first connected in the third step, before the formation of the later at least one second channel structure on the rear side of the substrate during the production of the particle protection element in the fourth step.

14. A particle protection element produced by:

providing a substrate in a first step;

applying a first silicon dioxide layer to a surface of the substrate and structuring the first silicon dioxide layer in a second step;

depositing a first polysilicon layer onto a surface of the first silicon dioxide layer and/or of the substrate and structuring the first polysilicon layer for forming a later at least one first channel structure in a third step, wherein a height of a later plurality of media passage structures of the particle protection element, which form a filter function with respect to penetrating particles, and/or a height of the later at least one first channel structure can be set based on a thickness of the first silicon dioxide layer; and forming a later at least one second channel structure through the substrate starting from a rear side of the substrate in a fourth step;

wherein the later at least one first channel structure and/or the later plurality of media passage structures and/or the later at least one second channel structure are configured to be connectable with regard to a media flow.

15. A pressure sensor produced by:

providing a further substrate, configured as a pressure sensor element and having a membrane, in a first step;

providing in a second step a particle protection element for the membrane of the further substrate configured as a pressure sensor element; and connecting in a third step the further substrate and the particle protection element using a bonding method;

wherein the particle protection element is produced by:

providing a substrate in another first step, applying a first silicon dioxide layer to a surface of the substrate and structuring the first silicon dioxide layer in another second step, depositing a first polysilicon layer onto a surface of the first silicon dioxide layer and/or of the substrate and structuring the first polysilicon layer for forming a later at least one first channel structure in another third step, wherein a height of a later plurality of media passage structures of the particle protection element, which form a filter function with respect to penetrating particles, and/or a height of the later at least one first channel structure can be set based on a thickness of the first silicon dioxide layer, and forming a later at least one second channel structure through the substrate starting from a rear side of the substrate in a fourth step, wherein the later at least one first channel structure and/or the later plurality of media passage structures and/or the later at least one second channel structure are configured to be connectable with regard to a media flow.

* * * * *